(12) United States Patent
Tani et al.

(10) Patent No.: US 9,515,641 B2
(45) Date of Patent: Dec. 6, 2016

(54) VOLTAGE LEVEL DETECTOR, MOTOR DRIVE CONTROLLER, MOTOR APPARATUS, AND METHOD OF DETECTING VOLTAGE LEVEL

(71) Applicants: Hironobu Tani, Osaka (JP); Tomohiko Kamatani, Osaka (JP)

(72) Inventors: Hironobu Tani, Osaka (JP); Tomohiko Kamatani, Osaka (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/859,589

(22) Filed: Sep. 21, 2015

(65) Prior Publication Data

US 2016/0094211 A1   Mar. 31, 2016

(30) Foreign Application Priority Data

Sep. 30, 2014   (JP) .................................. 2014-201929

(51) Int. Cl.
   *H02P 6/00*        (2016.01)
   *H03K 5/153*       (2006.01)
   *H02P 6/14*        (2016.01)

(52) U.S. Cl.
   CPC .................. *H03K 5/153* (2013.01); *H02P 6/14* (2013.01)

(58) Field of Classification Search
   CPC .......... H02M 1/08; H02M 1/32; H02M 3/156; H03K 17/0822; H03K 17/18; H03K 2017/0806; H03K 5/153; H02P 6/14
   USPC ............ 318/400.06, 400.03, 400.14, 400.35; 327/107, 105; 361/56, 33, 21
   See application file for complete search history.

(56) References Cited

U.S. PATENT DOCUMENTS

| | | | | |
|---|---|---|---|---|
| 3,585,507 A | * | 6/1971 | Bickel | G11B 20/10009 327/18 |
| 3,822,399 A | * | 7/1974 | Grund | H03K 5/1532 324/103 P |
| 3,921,010 A | * | 11/1975 | Griffin | G01R 19/04 327/58 |
| 4,626,933 A | * | 12/1986 | Bucska | G11B 20/10009 360/39 |
| 4,634,895 A | * | 1/1987 | Luong | G01R 19/04 327/62 |
| 4,634,896 A | * | 1/1987 | Shrinkle | H03K 5/1532 327/165 |
| 4,686,389 A | * | 8/1987 | Seifert | G11C 27/026 327/58 |
| 5,315,168 A | * | 5/1994 | Norton, Jr. | H03K 5/1532 327/58 |

(Continued)

FOREIGN PATENT DOCUMENTS

| | | |
|---|---|---|
| JP | 2013-099022 | 5/2013 |
| JP | 2013-099023 | 5/2013 |

*Primary Examiner* — Rita Leykin
(74) *Attorney, Agent, or Firm* — Cooper & Dunham LLP

(57) ABSTRACT

A voltage level detector is provided. The voltage level detector includes a comparator and a threshold level changer. The comparator compares a voltage level of an increasing or decreasing input signal with a threshold level, and generates and outputs a voltage level detection signal indicating that the input signal has reached the threshold level. The threshold level changer changes the threshold level of the comparator based on the voltage level detection signal by increasing the threshold level when the input signal is monotonically increasing and decreasing the threshold level when the input signal is monotonically decreasing.

8 Claims, 25 Drawing Sheets

(56) References Cited

U.S. PATENT DOCUMENTS

| | | | | | |
|---|---|---|---|---|---|
| 5,615,223 | A | * | 3/1997 | Carr | G11B 20/10009 360/46 |
| 5,697,846 | A | * | 12/1997 | Uenohara | F16F 15/1295 192/212 |
| 5,808,822 | A | * | 9/1998 | Kurachi | G11B 5/012 360/51 |
| 5,841,602 | A | * | 11/1998 | Kanegae | G11B 20/10009 360/46 |
| 5,847,891 | A | * | 12/1998 | Ohmori | G11B 20/10009 360/40 |
| 6,002,538 | A | * | 12/1999 | Kanegae | G11B 20/10009 360/46 |
| 8,964,343 | B2 | * | 2/2015 | Murakami | H03K 17/0822 361/56 |
| 2013/0099708 | A1 | * | 4/2013 | Shimizu | H02P 21/146 318/400.39 |
| 2013/0106326 | A1 | * | 5/2013 | Kamatani | H02P 6/16 318/400.06 |
| 2013/0106327 | A1 | * | 5/2013 | Kamatani | H02P 6/16 318/400.06 |
| 2013/0314132 | A1 | * | 11/2013 | Fukuta | H03K 17/18 327/109 |
| 2015/0253159 | A1 | | 9/2015 | Kamatani et al. | |

* cited by examiner

FIG. 5

| INPUT SIGNAL | | | OUTPUT SIGNAL | |
|---|---|---|---|---|
| R | L | G | Q | QB |
| H | X | X | L | H |
| L | L | H | L | H |
| L | H | H | H | L |
| L | X | L | HOLDING | HOLDING |

FIG. 21

| INTERSECTION DETECTION SIGNAL | HIGH LEVEL (Hi) | LOW LEVEL (Low) |
|---|---|---|
| UV | U1 ≥ V1 | U1 < V1 |
| VW | V1 ≥ W1 | V1 < W1 |
| WU | W1 ≥ U1 | W1 < U1 |

FIG. 22

| PERIOD | INPUT CONDITION FOR EACH SIGNAL | SELECTED SIGNAL | SIGNAL PHASE (°) |
|---|---|---|---|
| T1 | UV = Hi, VW = WU = Low | W1 | 150 – 210 |
| T2 | UV = VW = Hi, WU = Low | V1 | −30 – 30 |
| T3 | UV = WU = Low, VW = Hi | U1 | 150 – 210 |
| T4 | UV = Low, VW = WU = Hi | W1 | −30 – 30 |
| T5 | UV = VW = Low, WU = Hi | V1 | 150 – 210 |
| T6 | UV = WU = Hi, VW = Low | U1 | −30 – 30 |

VOLTAGE LEVEL DETECTOR, MOTOR DRIVE CONTROLLER, MOTOR APPARATUS, AND METHOD OF DETECTING VOLTAGE LEVEL

CROSS-REFERENCE TO RELATED APPLICATIONS

This patent application is based on and claims priority pursuant to 35 U.S.C. §119(a) to Japanese Patent Application No. 2014-201929, filed on Sep. 30, 2014, in the Japan Patent Office, the entire disclosure of which is hereby incorporated by reference herein.

BACKGROUND

Technical Field

The present disclosure relates to a voltage level detector, a motor drive controller, a motor apparatus, and a method of detecting voltage level.

Description of the Related Art

A voltage level detection mechanism which detects the voltage level of an input signal by detecting the input signal reaching a plurality of threshold levels is known.

To improve detection accuracy, such a conventional voltage level detection mechanism requires a larger number of comparators, which causes a problem of an enlarged circuit area. Since the voltage level detection mechanism detects the voltage level of an input signal by detecting the input signal reaching a predetermined threshold level, more threshold levels should be set to improve detection accuracy. For example, in a case where approximately 1,000 threshold levels are set for securing a desired detection accuracy, the same number of comparators should be provided while disadvantageously enlarging the circuit area.

SUMMARY

In accordance with some embodiments of the present invention, a voltage level detector is provided. The voltage level detector includes a comparator and a threshold level changer. The comparator compares a voltage level of an increasing or decreasing input signal with a threshold level, and generates and outputs a voltage level detection signal indicating that the input signal has reached the threshold level. The threshold level changer changes the threshold level of the comparator based on the voltage level detection signal by increasing the threshold level when the input signal is monotonically increasing and decreasing the threshold level when the input signal is monotonically decreasing.

In accordance with some embodiments of the present invention, another voltage level detector is provided. This voltage level detector includes a plurality of comparators and a threshold level changer. Each of the comparators has a different threshold level, and compares a voltage level of a fluctuating input signal with a threshold level thereof and generating and outputting a voltage level detection signal indicating that the input signal has reached the threshold level. The threshold level changer changes the threshold levels of the comparators based on the voltage level detection signals by, when the input signal has increased to reach one of the threshold levels, raising the threshold levels which are smaller than the one of threshold level thereabove, and when the input signal has decreased to reach one of the threshold levels, lowering the threshold levels which are larger than the one of the threshold levels therebelow.

In accordance with some embodiments of the present invention, a motor drive controller is provided. The motor drive controller includes the above voltage level detector, a motor controller, and a motor driver. The motor controller outputs a drive signal based on the voltage level detection signal output from the voltage level detector. The motor driver drives a motor based on the drive signal.

In accordance with some embodiments of the present invention, a motor apparatus is provided. The motor apparatus includes the above motor drive controller and a motor driven-controlled by the motor drive controller.

In accordance with some embodiments of the present invention, a method of detecting voltage level is provided. The method includes the steps of comparing a voltage level of a fluctuating input signal with a plurality of threshold levels, generating and outputting voltage level detection signals each indicating that the input signal has reached each of the threshold levels, and changing the threshold levels based on the voltage level detection signals. The step of the changing further includes the steps of, when the input signal has increased to reach one of the threshold levels, raising the threshold levels which are smaller than the one of the threshold levels thereabove, and when the input signal has decreased to reach one of the threshold levels, lowering the threshold levels which are larger than the one of the threshold levels therebelow.

BRIEF DESCRIPTION OF THE SEVERAL VIEWS OF THE DRAWINGS

A more complete appreciation of the disclosure and many of the attendant advantages and features thereof can be readily obtained and understood from the following detailed description with reference to the accompanying drawings, wherein:

FIG. 5 is a table showing signal holding conditions for a latch circuit 53-$n$ illustrated in FIG. 4;

FIG. 21 is a table showing intersection phase detection signals UV, VW, and WU indicating comparison results for sensor signals U1, V1, and W1 by an intersection phase detection circuit 10 illustrated in FIG. 20;

FIG. 22 is a table showing signal selection conditions for a signal selection circuit 20 illustrated in FIG. 20;

Figure 1:
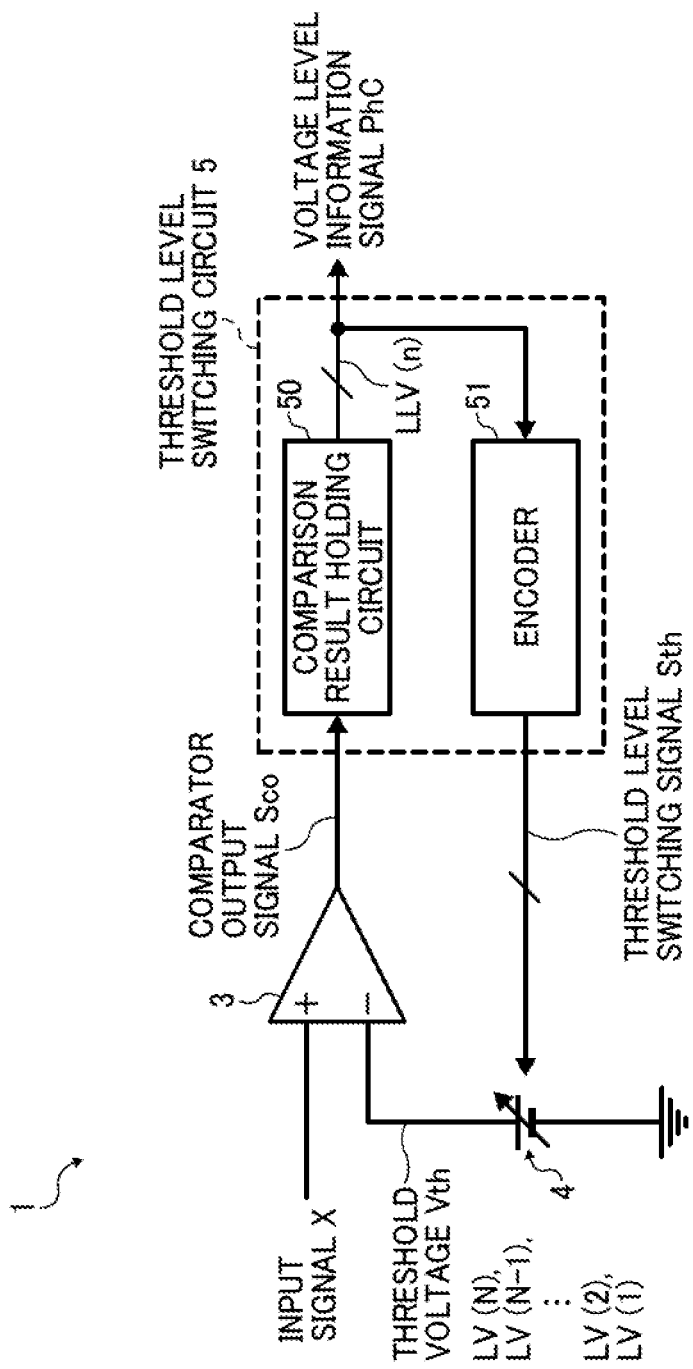
FIG. 1 is a block diagram showing the configuration of a voltage level detector 1 in accordance with an embodiment (Embodiment 1) of the present invention.

The accompanying drawings are intended to depict example embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that operate in a similar manner.

In accordance with some embodiments of the present invention, a voltage level detector which is able to detect voltage level with a reduced circuit area is provided.

Embodiment 1

FIG. 1 is a block diagram showing the configuration of a voltage level detector 1 in accordance with an embodiment (Embodiment 1) of the present invention. The voltage level detector 1 includes a comparator 3, a variable voltage source 4, and a threshold level switching circuit 5. The threshold level switching circuit 5 includes a comparison result holding circuit 50 and an encoder 51. In the present embodiment, the voltage level of an input signal is detected by comparing the input signal with a predetermined threshold level by the single comparator 3 and switching the threshold level of the comparator 3 so as to follow the input signal.

Referring to FIG. 1, an input signal X has a voltage level that monotonically increases or decreases in a continuous manner. The input signal X is input to a non-inversion input terminal The variable voltage source 4 applies a threshold voltage Vth, having a threshold level LV(n) (n=1, 2, ..., N) that is one of multiple threshold levels LV(1), LV(2), ..., LV(N) set at predetermined intervals, to an inversion input terminal of the comparator 3. The comparator 3 compares the input signal X with the threshold voltage Vth. When the input signal X is equal to or greater than the threshold voltage Vth, the comparator 3 outputs a comparator output signal Sco having a high level to the threshold level switching circuit 5. When the input signal X is less than the threshold voltage Vth, the comparator 3 outputs a comparator output signal Sco having a low level to the threshold level switching circuit 5.

In the threshold level switching circuit 5, the comparison result holding circuit 50 holds a holding level signal LLV(n) indicating a comparison result between the input signal X and the threshold level LV(n) according to the comparator output signal Sco, and outputs it to the encoder 51. When the input signal X is equal to or greater than the threshold level LV(n), the comparison result holding circuit 50 outputs a holding level signal LLV(n) having a high level. When the input signal X is less than the threshold level LV(n), the comparison result holding circuit 50 outputs a holding level signal LLV(n) having a low level. In addition to being output to the encoder 51, the holding level signal LLV(n) is also output as a voltage level information signal PhC indicating whether the input signal X has reached the threshold level LV(n) or not.

The encoder 51 converts each of the holding level signals LLV(1) to LLV(N) into a threshold level switching signal Sth by encoding bit number N. The threshold level switching circuit 5 outputs the threshold level switching signal Sth to the variable voltage source 4, and switches the threshold voltage Vth of the variable voltage source 4 among the multiple threshold levels LV(1) to LV (N) in accordance with variations in the holding level signals LLV(1) to LLV(N).

Figure 2:
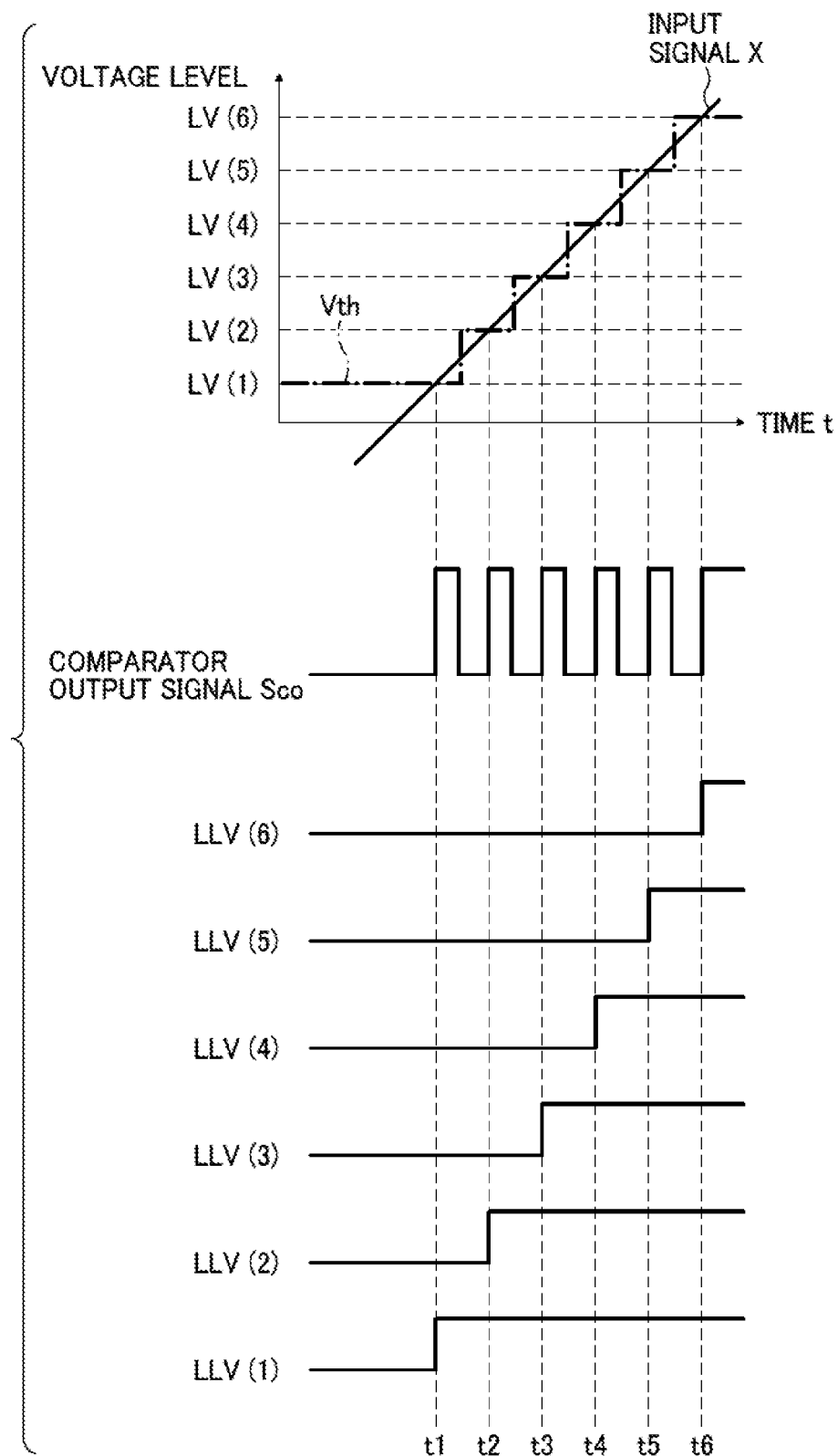
FIG. 2 is a timing diagram for various signals showing a voltage level detection operation by the voltage level detector 1 illustrated in FIG. 1 for a monotonically-increasing input signal X.
Figure 3:
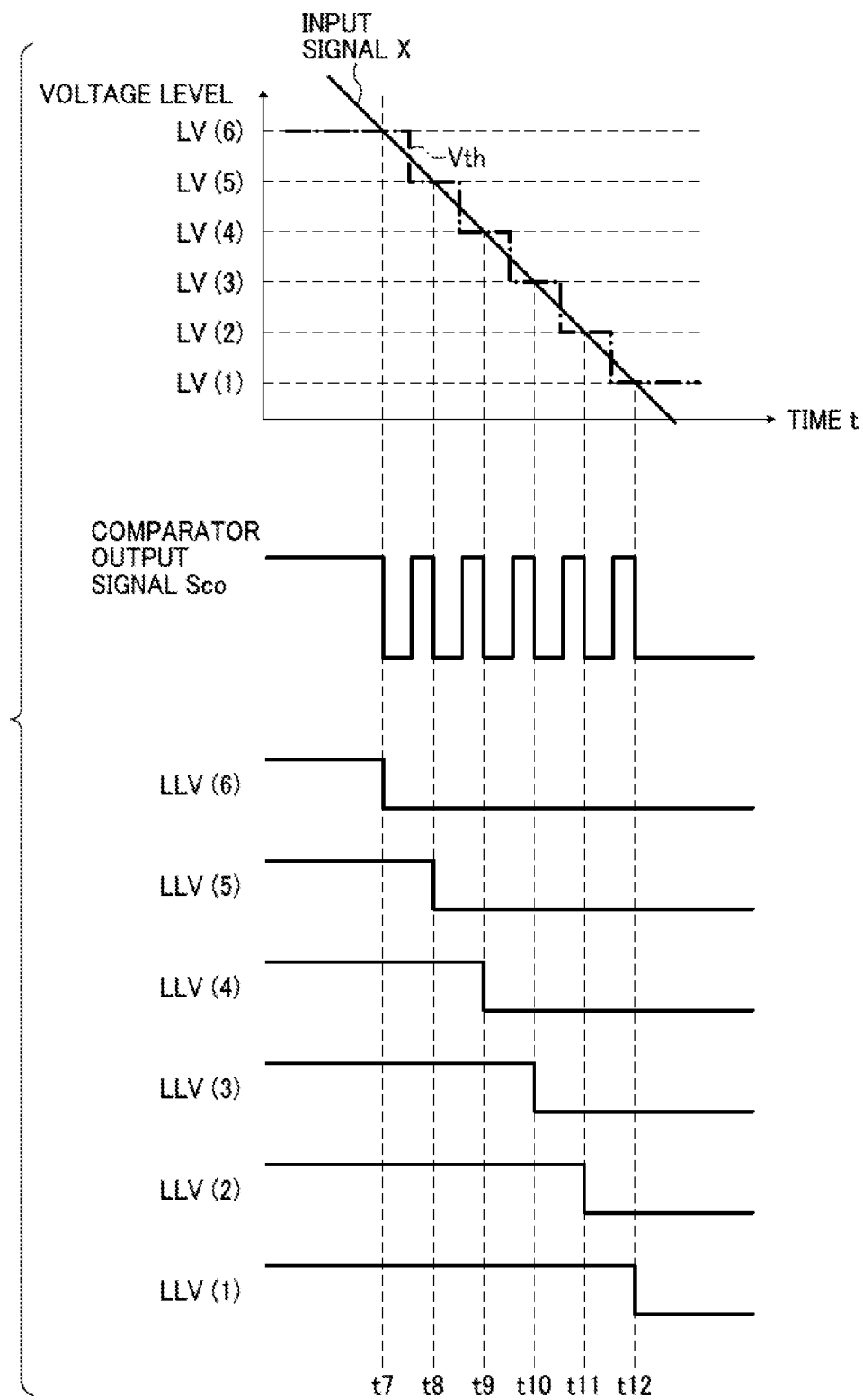
FIG. 3 is a timing diagram for various signals showing a voltage level detection operation by the voltage level detector 1 illustrated in FIG. 1 for a monotonically-decreasing input signal X.

FIG. 2 is a timing diagram for various signals showing a voltage level detection operation by the voltage level detector 1 illustrated in FIG. 1 for a monotonically-increasing input signal X. FIG. 3 is a timing diagram for various signals showing a voltage level detection operation by the voltage level detector 1 illustrated in FIG. 1 for a monotonically-decreasing input signal X. The voltage level detection operation by the voltage level detector 1 is described below with reference to FIGS. 1 to 3.

In FIG. 2, the input signal X is monotonically increasing from a voltage level smaller than the threshold level LV(1) to a voltage level greater than the threshold level LV(6). At a time t1, the input signal X becomes equal to or greater than the threshold level LV(1) of the threshold voltage Vth, and the comparator 3 outputs a comparator output signal Sco which rises from a low level to a high level. According to the comparator output signal Sco risen to a high level, the comparison result holding circuit 50 generates a holding level signal LLV(1) having a high level and outputs it as the voltage level information signal PhC indicating that the input signal X has reached the threshold level LV(1). In addition, the comparison result holding circuit 50 converts the holding level signal LLV(1) having a high level into the threshold level switching signal Sth by the encoder 51 so as to raise the threshold level of the threshold voltage Vth from LV(1) to LV(2). As a result, the threshold voltage Vth of the comparator 3 exceeds the voltage level of the input signal X, and the comparator output signal Sco returns from a high level to a low level.

At a time tn (n=2, 3, . . . , 6), the input signal X becomes equal to or greater than the threshold level LV(n) of the threshold voltage Vth. Similar to the case at t1, according to rising of the comparator output signal Sco, the comparison result holding circuit 50 successively generates a holding level signal LLV(n) having a high level and outputs it as the voltage level information signal PhC. The holding level signal LLV(n) is converted into the threshold level switching signal Sth by the encoder 51 so as to raise the threshold level of the threshold voltage Vth from LV(n) to LV(n+1). As a result, the threshold voltage Vth exceeds the voltage level of the input signal X, and the voltage level detector 1 successively detects the input signal X reaching the threshold level LV(n).

In FIG. 3, the input signal X is monotonically decreasing from a voltage level greater than the threshold level LV(6) to a voltage level smaller than the threshold level LV(1). At a time tn (n=7, 8, . . . , 12), the input signal X falls below the threshold level LV(13-*n*). Similar to the case of monotonic increasing illustrated in FIG. 2, according to falling of the comparator output signal Sco, the comparison result holding circuit 50 successively generates a holding level signal LLV(13-*n*) having a low level and outputs it as the voltage level information signal PhC. The holding level signal LLV(13-*n*) is converted into the threshold level switching signal Sth by the encoder 51 so as to lower the threshold level of the threshold voltage Vth from LV(13-*n*) to LV(12-*n*). As a result, the threshold voltage Vth exceeds the voltage level of the input signal X, and the voltage level detector 1 successively detects the input signal X reaching the threshold level LV(13-*n*).

The voltage level detection operation by the voltage level detector 1 has been described referring to six threshold levels LV(1) to LV(6) as shown in FIGS. 2 and 3. The number of threshold levels LV(n) (n=1, 2, . . . , N) is not limited to six and is arbitrarily determined. The following description is based on the case where N is 6 for the purpose of illustration.

Figure 4:
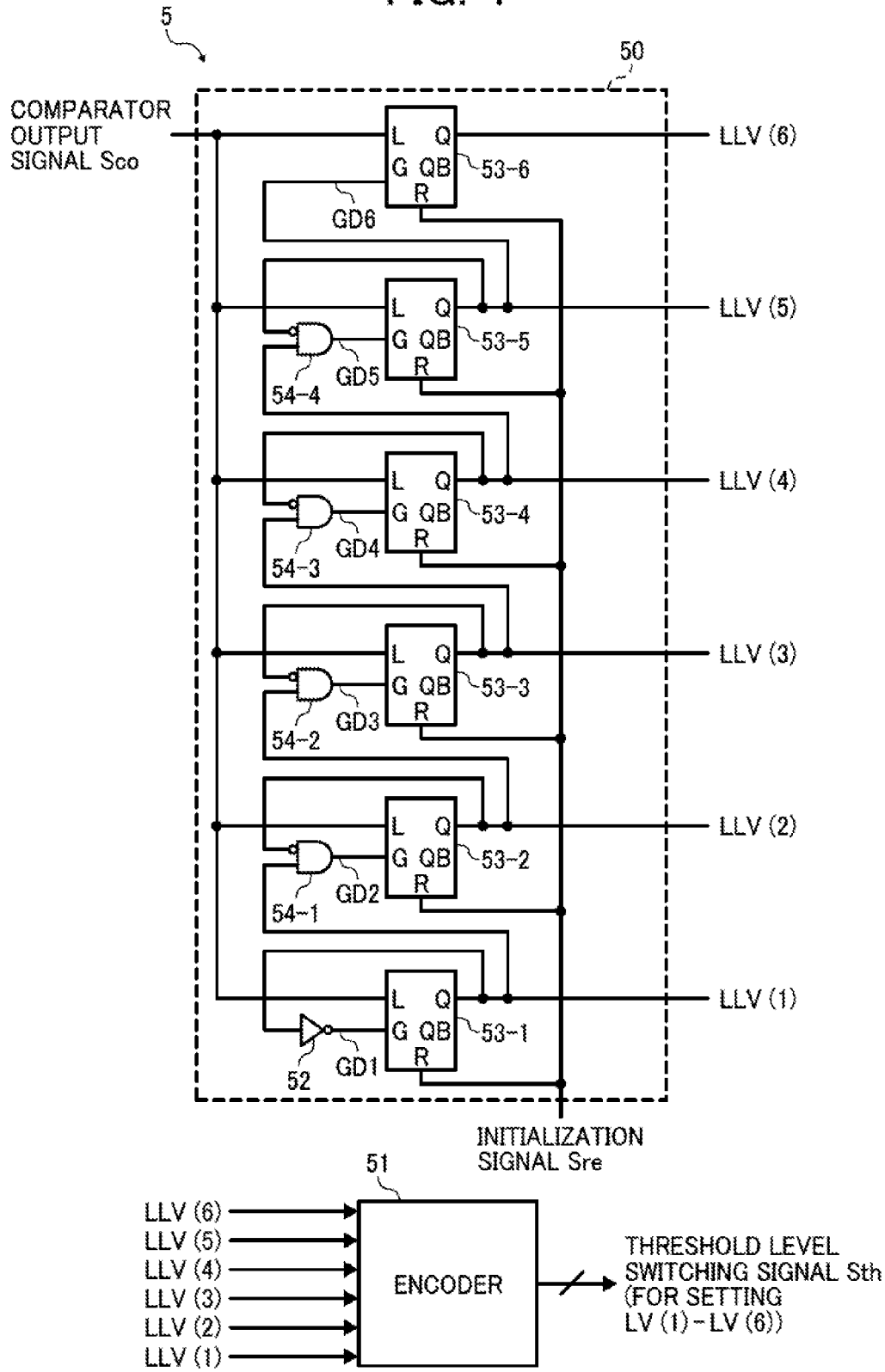
FIG. 4 is a circuit diagram showing the configuration of a threshold level switching circuit 5 when N is 6 in the voltage level detector 1 illustrated in FIG. 1.

FIG. 4 is a circuit diagram showing the configuration of the threshold level switching circuit 5 when N is 6 in the voltage level detector 1 illustrated in FIG. 1. Referring to FIG. 4, the comparison result holding circuit 50 of the threshold level switching circuit 5 includes a NOT gate 52, latch circuits 53-1 to 53-6, and logical gates 54-1 to 54-4. Each of the latch circuits 53-1 to 53-6 is composed of a D-type flip-flop.

FIG. 5 is a table showing signal holding conditions for the latch circuit 53-*n* (n=1, 2, . . . , 6) illustrated in FIG. 4. As shown in FIG. 5, the latch circuit 53-*n* is reset when an initialization signal Sre externally supplied to a reset terminal R is set to a high level, and is put into an operating state when the initialization signal Sre is set to a low level. During the operating state, the latch circuit 53-*n* is put into a state of being capable of capturing signals when a logical signal having a high level (H) is input to an input terminal G, and is put into a state of holding signals when a logical signal having a low level (L) is input to the input terminal G.

Referring to FIG. 4, the comparator output signal Sco from the comparator 3 illustrated in FIG. 1 is input to each input terminal L of each of the latch circuits 53-1 to 53-6. The NOT gate 52 inverts the holding level signal LLV(1) from the latch circuit 53-1 as a gate signal GD1, and outputs it to the input terminal G of the latch circuit 53-1. The latch circuit 53-1 captures the comparator output signal Sco according to the gate signal GD1, and outputs the captured comparator output signal Sco to the encoder 51 as the holding level signal LLV(1).

The logical gate 54-(n−1) (n=2, . . . , 4, 5) performs an operation of a logical AND of an inversion signal of the holding level signal LLV(n) from the latch circuit 53-*n* and the holding level signal LLV(n−1) from the latch circuit 53-(n−1). The logical gate 54-(n−1) outputs a gate signal GDn indicating the operation result to the input terminal G of the latch circuit 53-*n*. The latch circuit 53-*n* captures the comparator output signal Sco according to the gate signal GDn, and outputs the captured comparator output signal Sco to the encoder 51 as the holding level signal LLV(n). The latch circuit 53-6 captures the comparator output signal Sco according to the gate signal GD6 that is equivalent to the holding level signal LLV(5), and outputs the captured comparator output signal Sco to the encoder 51 as the holding level signal LLV(6). Each of the latch circuits 53-*n* (n=1, 2, . . . , 6) is corresponding to each of the threshold levels LV(n). Each of the latch circuits 53-*n* captures the comparator output signal Sco at a predetermined timing to hold it as the holding level signal LLV(n).

Figure 6:
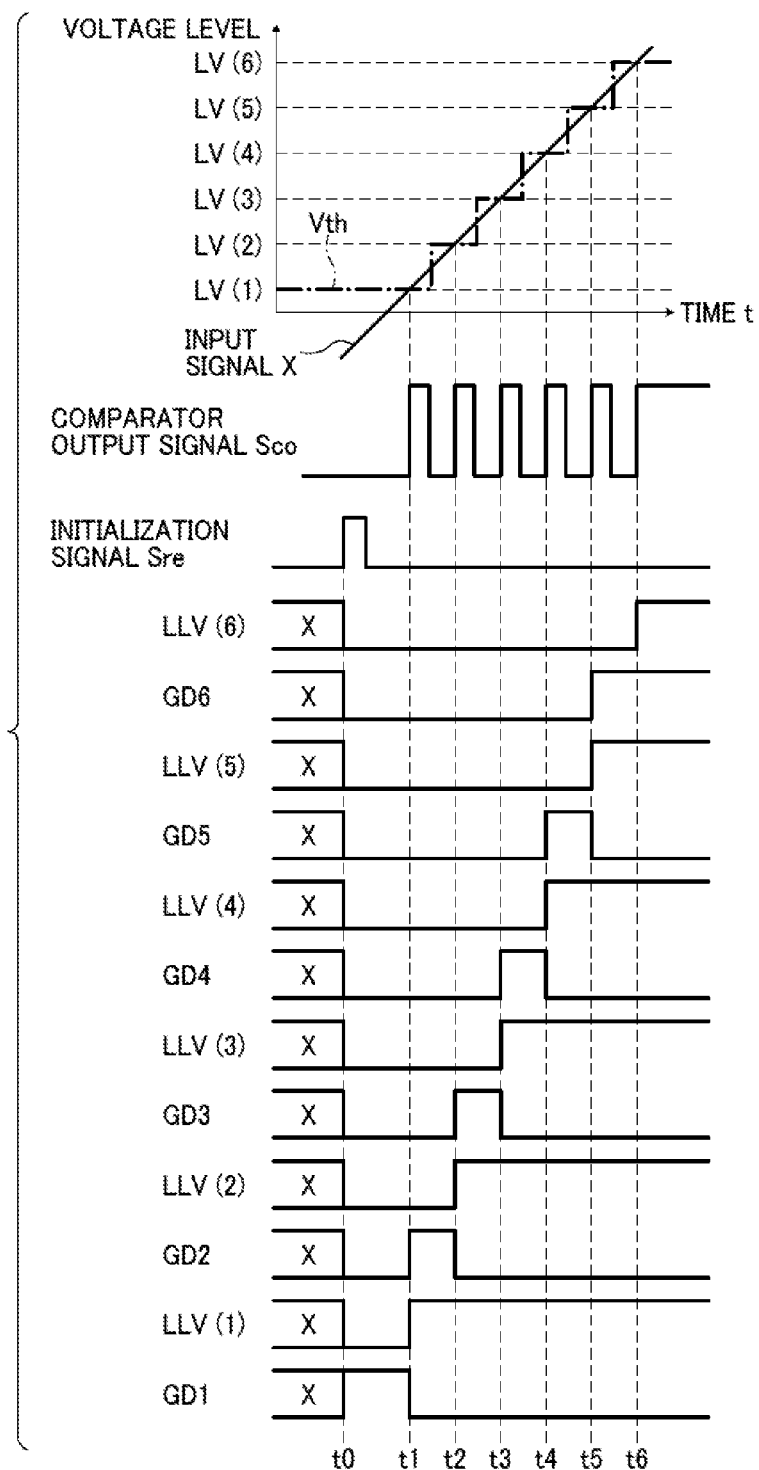
FIG. 6 is a timing diagram for various signals showing an operation by the threshold level switching circuit 5 illustrated in FIG. 4.

FIG. 6 is a timing diagram for various signals showing an operation by the threshold level switching circuit 5 illustrated in FIG. 4. As shown in FIG. 6, at a time t0, a monotonically-increasing input signal X is smaller than any of the threshold levels LV(n). At this time, the threshold voltage Vth of the comparator 3 has a threshold level LV(1), and the comparator output signal Sco from the comparator 3 has a low level.

At the time t0, each of the latch circuits 53-*n* is reset by the initialization signal Sre, and all the holding level signals LLV(n) have a low level. Since the holding level signal LLV(1) is inverted by the NOT gate 52 to become the gate signal GD1 having a high level, the latch circuit 53-1 is put into a state of being capable of capturing signals. Since the gate signals GD2 to GD5 have a low level according to a logical operation based on the holding level signals LLV(n) performed by the logical gates 54-1 to 54-4, the latch circuits 53-2 to 53-6 are put into a state of holding signals. Accordingly, after a lapse of the time t0, signal capturing is started from the latch circuit 53-1.

At a time t1 in FIG. 6, the input signal X becomes equal to or greater than the threshold level LV(1), and the comparator 3 outputs a comparator output signal Sco which rises from a low level to a high level. In accordance with the above operation, the latch circuit 53-1 captures the comparator output signal Sco having a high level and holds it as the holding level signal LLV(1). The holding level signal LLV(1) having changed to a high level makes it possible to detect the increasing input signal X reaching the threshold level LV(1). The threshold voltage Vth is switched from the threshold level LV(1) to the threshold level LV(2) by the encoder 51 based on the changed holding level signal LLV (1). As a result, the input signal X falls below the threshold voltage Vth, and the comparator output signal Sco returns to a low level.

Since the holding level signal LLV(1) having changed to a high level is inverted by the NOT gate 52 to become the gate signal GD1 having a low level, the latch circuit 53-1 is put into a state of holding signals. In addition, since the gate signal GD2 from the logical gate 54-1 has a high level according to the holding level signal LLV (1) having changed to a high level, the latch circuit 53-2 is put into a state of being capable of capturing signals. The latch circuit 53-$n$ (n=1, 2, . . . , 6) in a state of being capable of capturing signals is successively switched according to the change of the holding level signal LLV(n) to a high level.

At the time tn (n=2, 3, . . . , 6), similar to the case at the time t1, successively, the latch circuit 53-$n$ in a state of being capable of capturing signals captures the comparator output signal Sco having changed to a high level, and holds it as the holding level signal LLV(n). The holding level signal LLV (n) having changed to a high level makes it possible to detect the increasing input signal X reaching the threshold level LV(n). The threshold level switching circuit 5 switches the threshold voltage Vth of the comparator 3 so as to raise it from the threshold level LV(n) to the threshold level LV(n+1) according to the change of the holding level signal LLV(n) (n=2, 3, . . . , 5) to a high level. It is possible to detect the voltage level of the input signal X by switching the threshold level LV(n) of the threshold voltage Vth so as to follow the input signal X without providing an individual comparator for each threshold level.

In accordance with the above-described embodiment (Embodiment 1) of the present invention, the voltage level detector 1 includes the comparator 3 and the threshold level switching circuit 5. The comparator 3 compares the voltage level of the input signal X that monotonically increases or decreases in a continuous manner with a predetermined threshold level LV(n), and generates and outputs the comparator output signal Sco indicating that the input signal X has reached the threshold level LV(n). The threshold level switching circuit 5 changes the threshold level LV(n) of the comparator 3 based on the comparator output signal Sco. The threshold level switching circuit 5 changes the threshold level of the comparator 3 so as to raise it when the input signal X is monotonically increasing and to lower it when the input signal X is monotonically decreasing.

Accordingly, it is possible to detect the input signal X reaching multiple threshold levels by use of the single comparator 3. This makes it possible to detect the voltage level with a reduced circuit area.

Modification 1 of Embodiment 1

Figure 7:
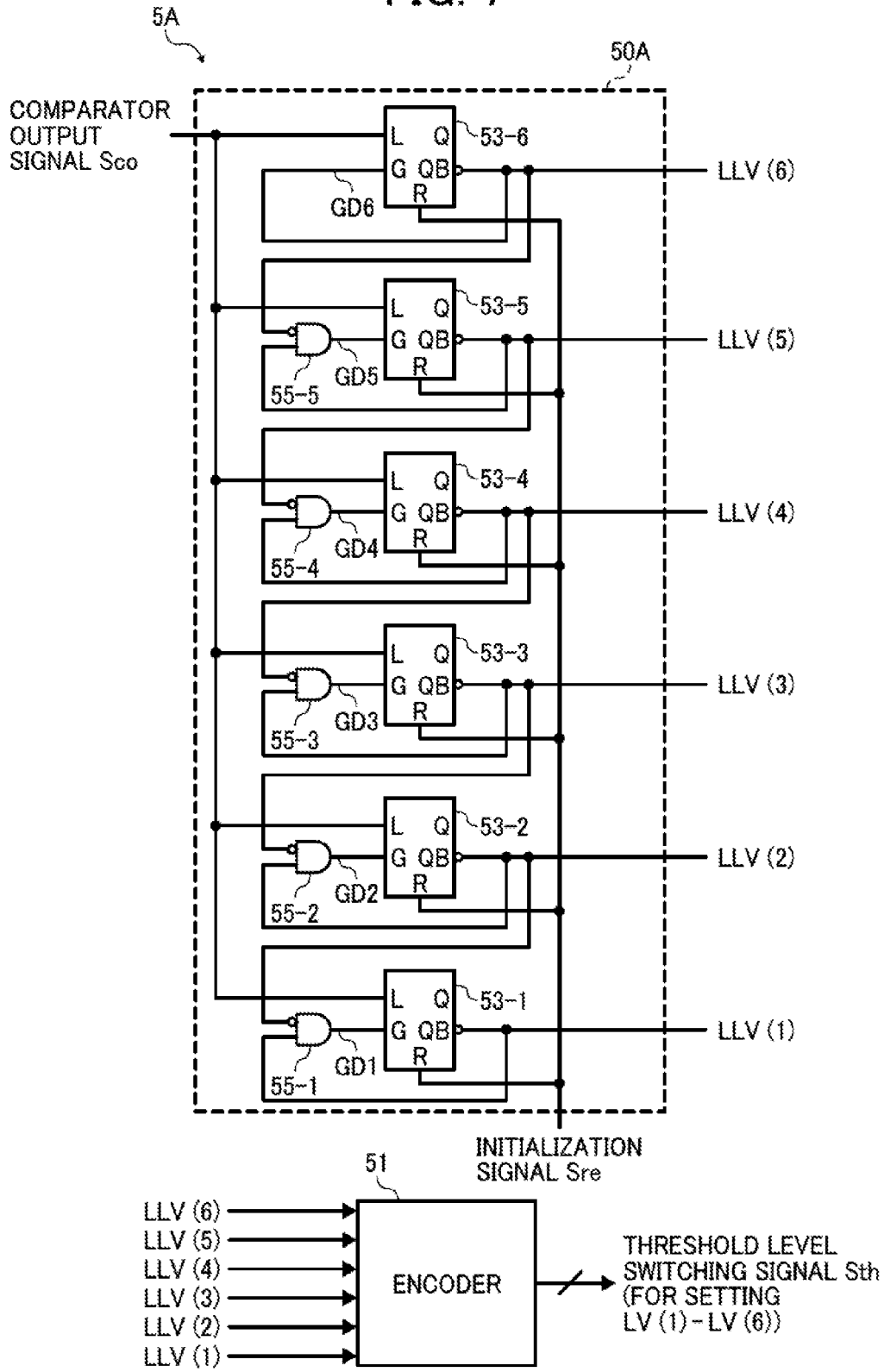
FIG. 7 is a circuit diagram showing the configuration of a threshold level switching circuit 5A in accordance with another embodiment (Modification 1 of Embodiment 1) of the present invention.

FIG. 7 is a circuit diagram showing the configuration of a threshold level switching circuit 5A according to another embodiment (Modification 1 of Embodiment 1) of the present invention. In the above-described embodiment (Embodiment 1), the comparison result holding circuit 50 illustrated in FIG. 4 detects the voltage level of the monotonically-increasing input signal X. The voltage level detector 1 may detect the voltage level of the monotonically-decreasing input signal X. In the present embodiment (Modification 1 of Embodiment 1), a comparison result holding circuit 50A detects the voltage level of the monotonically-decreasing input signal X as described below.

Referring to FIG. 7, the comparison result holding circuit 50A in accordance with Modification 1 of Embodiment 1 includes logical gates 55-1 to 55-5 in place of the NOT gate 52 and the logical gates 54-1 to 54-4 included in the comparison result holding circuit 50 illustrated in FIG. 4. The difference therebetween is described below.

In FIG. 7, the logical gate 55-$n$ (n=1, 2, . . . , 5) performs an operation of a logical AND of an inversion signal of the holding level signal LLV(n+1) and the holding level signal LLV(n), and inputs the gate signal GDn indicating the operation result to the input terminal L of the latch circuit 53-$n$. The holding level signal LLV(6) is input to the input terminal L of the latch circuit 53-6 as the gate signal GD6.

Figure 8:
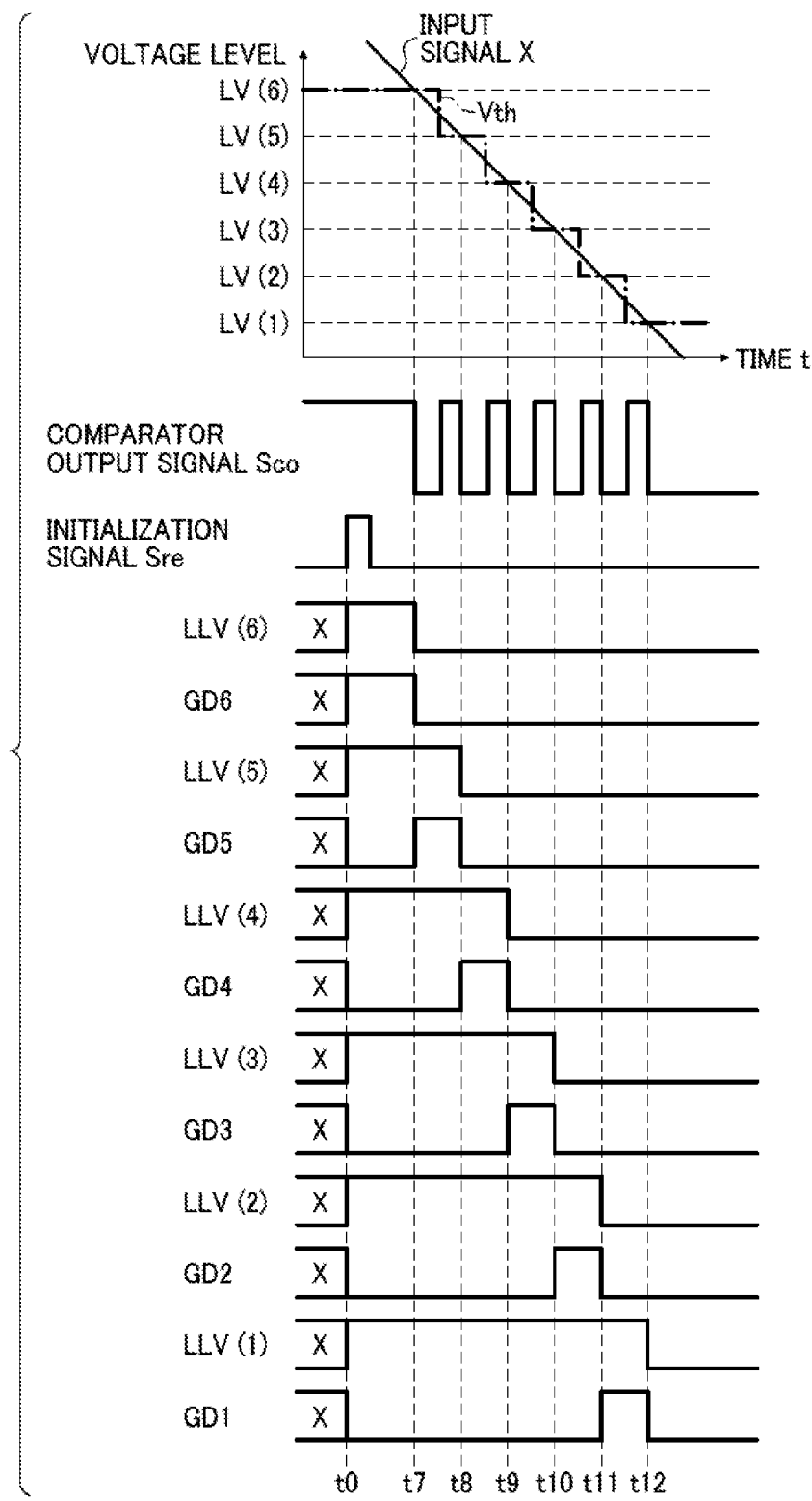
FIG. 8 is a timing diagram for various signals showing an operation by the threshold level switching circuit 5A illustrated in FIG. 7.

FIG. 8 is a timing diagram for various signals showing an operation by the threshold level switching circuit 5A illustrated in FIG. 7. As shown in FIG. 8, at a time t0, the monotonically-decreasing input signal X is greater than any of the threshold levels LV(n). At this time, the threshold voltage Vth of the comparator 3 has a threshold level LV(6), and the comparator output signal Sco from the comparator 3 has a high level. At the time t0, the holding level signals LLV(1) to LLV(6) each have a high level and the gate signal GD6 has a high level, while the gate signals GD1 to GD5 from the logical gates 55-1 to 55-5 each have a low level. Accordingly, signal capturing is started from the latch circuit 53-6. The latch circuit in a state of being capable of capturing signals is successively switched among the latch circuits 53-1 to 53-6 according to the changes of the holding level signals LLV(1) to LLV(6) to a low level.

At the time tn (n=7, 8, . . . , 12) in FIG. 8, successively, the latch circuit 53-(13-$n$) in a state of being capable of capturing signals captures the comparator output signal Sco having changed to a low level, and holds it as the holding level signal LLV(13-$n$). The holding level signal LLV(13-$n$) having changed to a low level makes it possible to detect the decreasing input signal X reaching the threshold level LV(13-$n$). The threshold level switching circuit 5 switches the threshold voltage Vth so as to lower it from the threshold level LV(13-$n$) to the threshold level LV(12-$n$) according to the change of the holding level signal LLV(13-$n$) (n=7, 8, . . . , 11) to a low level. It is possible to detect the voltage level of the input signal X, even when it monotonically decreases, without providing an individual comparator for each threshold level.

Modification 2 of Embodiment 1

Figure 9:
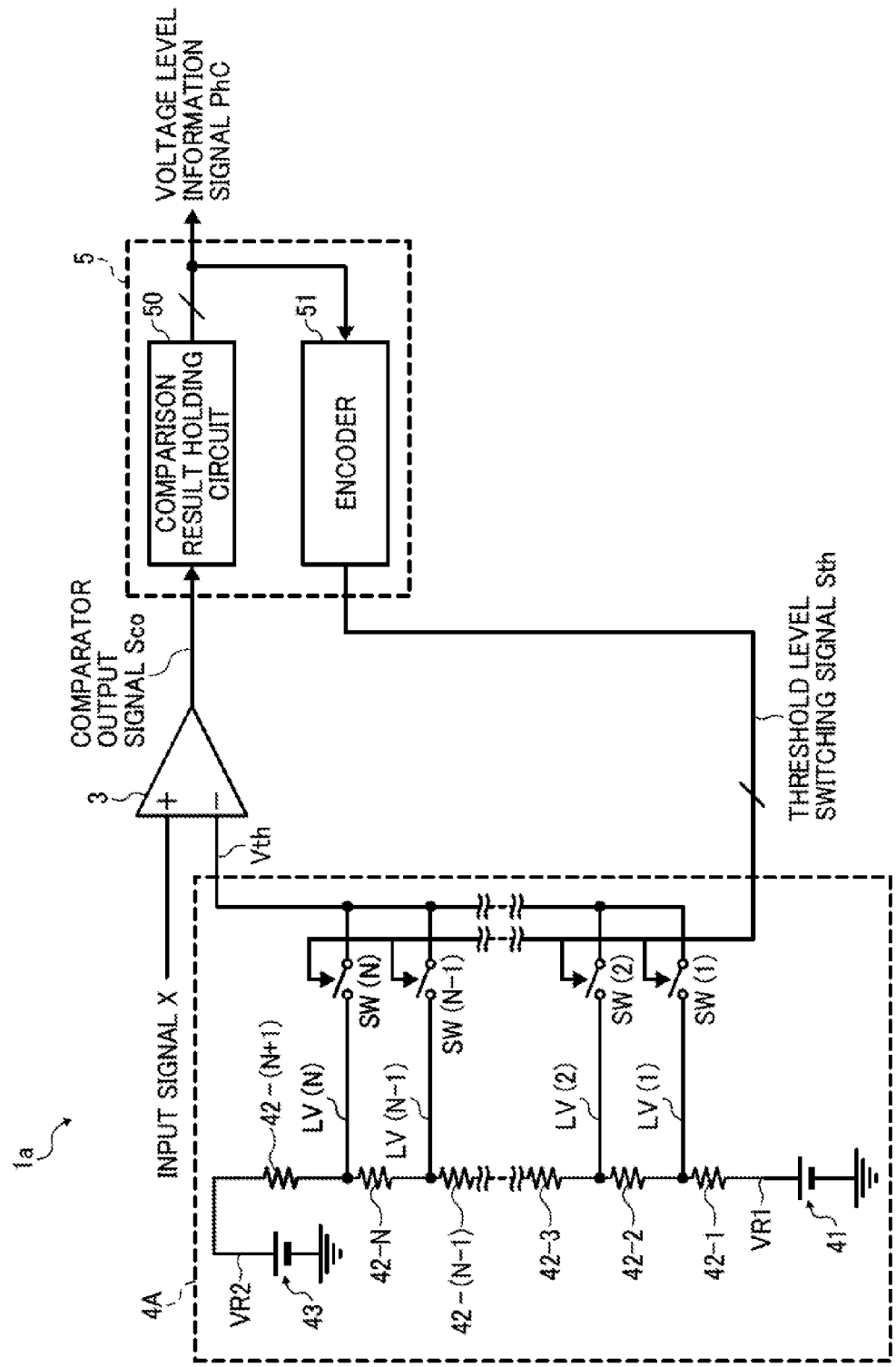
FIG. 9 is a block diagram showing the configuration of a voltage level detector 1$a$ in accordance with another embodiment (Modification 2 of Embodiment 1) of the present invention.

FIG. 9 is a block diagram showing the configuration of a voltage level detector 1$a$ in accordance with another embodiment (Modification 2 of Embodiment 1) of the present invention. The threshold voltage Vth of the comparator 3 can be switched among multiple threshold levels LV(1) to LV(N) by means of on-off control of switches. In the present embodiment (Modification 2 of Embodiment 1), the voltage level detector 1a includes a threshold level generation circuit 4A in place of the variable voltage source 4 included in the voltage level detector 1 according to Embodiment 1.

Referring to FIG. 9, the threshold level generation circuit 4A includes constant-voltage sources 41 and 43, voltage dividing resistances 42-1 to 42-(N+1), and switches SW(1) to SW(N). The voltage dividing resistances 42-1 to 42-(N+1) are connected in series between the constant-voltage source 41 having a reference voltage VR1 and the constant-voltage source 43 having a reference voltage VR2, and divide the voltage between the reference voltages VR1 and VR2 into threshold levels LV(1) to LV(N). One end of the switch SW(n) (n=1, 2, . . . , N) is connected to between the voltage dividing resistances 42-n and 42-(n+1) and the other end is connected to an inversion input terminal of the comparator 3. The switch SW(n) is on-off controlled by the threshold level switching signal Sth from the encoder 51 in such a manner that only one of the switches SW(1) to SW(N) is turned on.

When the input signal X monotonically increases, the encoder 51 outputs the threshold level switching signal Sth in such a manner that only the switch SW(n+1) is turned on according to the holding level signal LLV(n) changing from a low level to a high level. As a result, the threshold level LV(n) input to the comparator 3 can be raised to the threshold level LV(n+1), as shown in FIG. 2. When the input signal X monotonically decreases, the encoder 51 outputs the threshold level switching signal Sth in such a manner that only the switch SW(n) is turned on according to the holding level signal LLV(n) changing from a high level to a low level. As a result, the threshold level LV(n+1) input to the comparator 3 can be lowered to the threshold level LV(n), as shown in FIG. 3.

Embodiment 2

Figure 10:
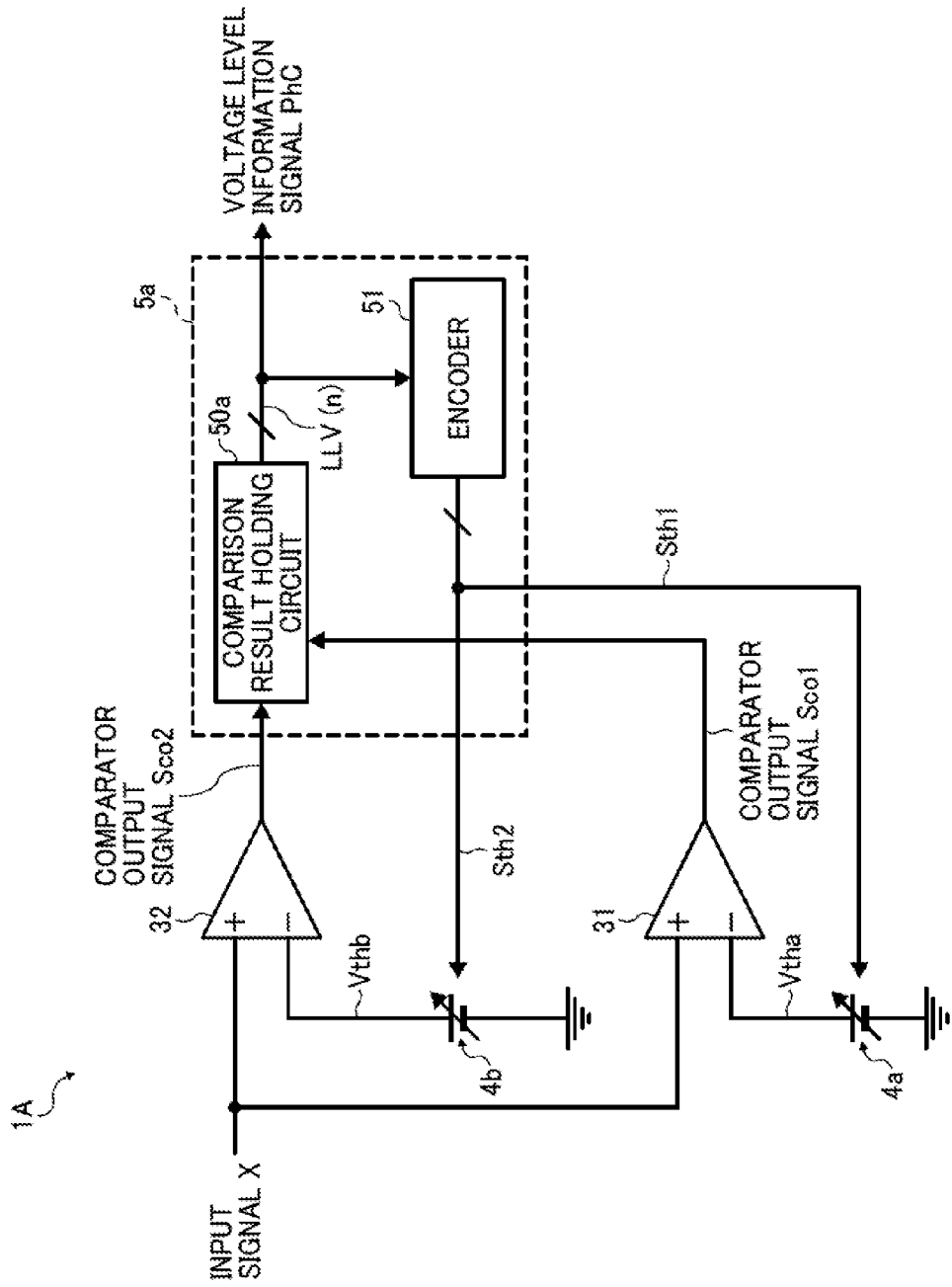
FIG. 10 is a block diagram showing the configuration of a voltage level detector 1A in accordance with another embodiment (Embodiment 2) of the present invention.

FIG. 10 is a block diagram showing the configuration of a voltage level detector 1A in accordance with another embodiment (Embodiment 2) of the present invention. In Embodiment 1, a single comparator is used for making the threshold level follow the input signal. However, alternatively, multiple comparators can be used. In the present embodiment (Embodiment 2), the voltage level detector 1A detects the voltage level of the input signal using two comparators by making two threshold levels follow the voltage level by sandwiching it. The voltage level detector 1A includes comparators 31 and 32, variable voltage sources 4a and 4b, and a threshold level switching circuit 5a, in place of the comparator 3, the variable voltage source 4, and the threshold level switching circuit 5 respectively included in the voltage level detector 1. The threshold level switching circuit 5a includes a comparison result holding circuit 50a.

Referring to FIG. 10, the variable voltage source 4a applies the threshold voltage Vtha to an inversion input terminal of the comparator 31, and the variable voltage source 4b applies the threshold voltage Vthb to an inversion input terminal of the comparator 32. The comparator 31 compares the input signal X with the threshold voltage Vtha, and outputs a comparator output signal Sco1 indicating a comparison result to the comparison result holding circuit 50a. The comparator 32 compares the input signal X with the threshold voltage Vthb, and outputs a comparator output signal Sco2 indicating a comparison result to the comparison result holding circuit 50a.

Figure 11:
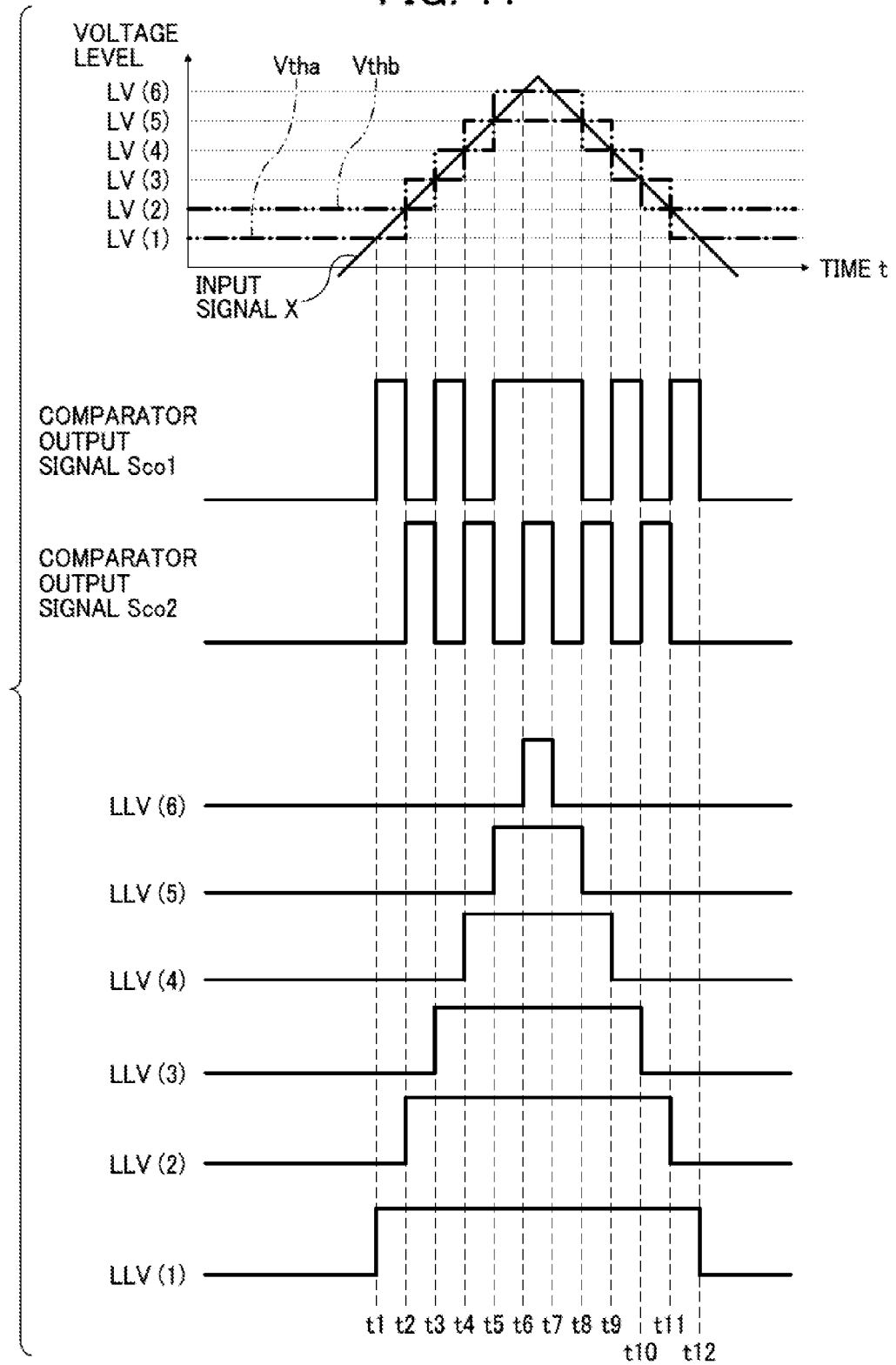
FIG. 11 is a timing diagram for various signals showing a voltage level detection operation by the voltage level detector 1A illustrated in FIG. 10 for an input signal X having a peak value.
Figure 12:
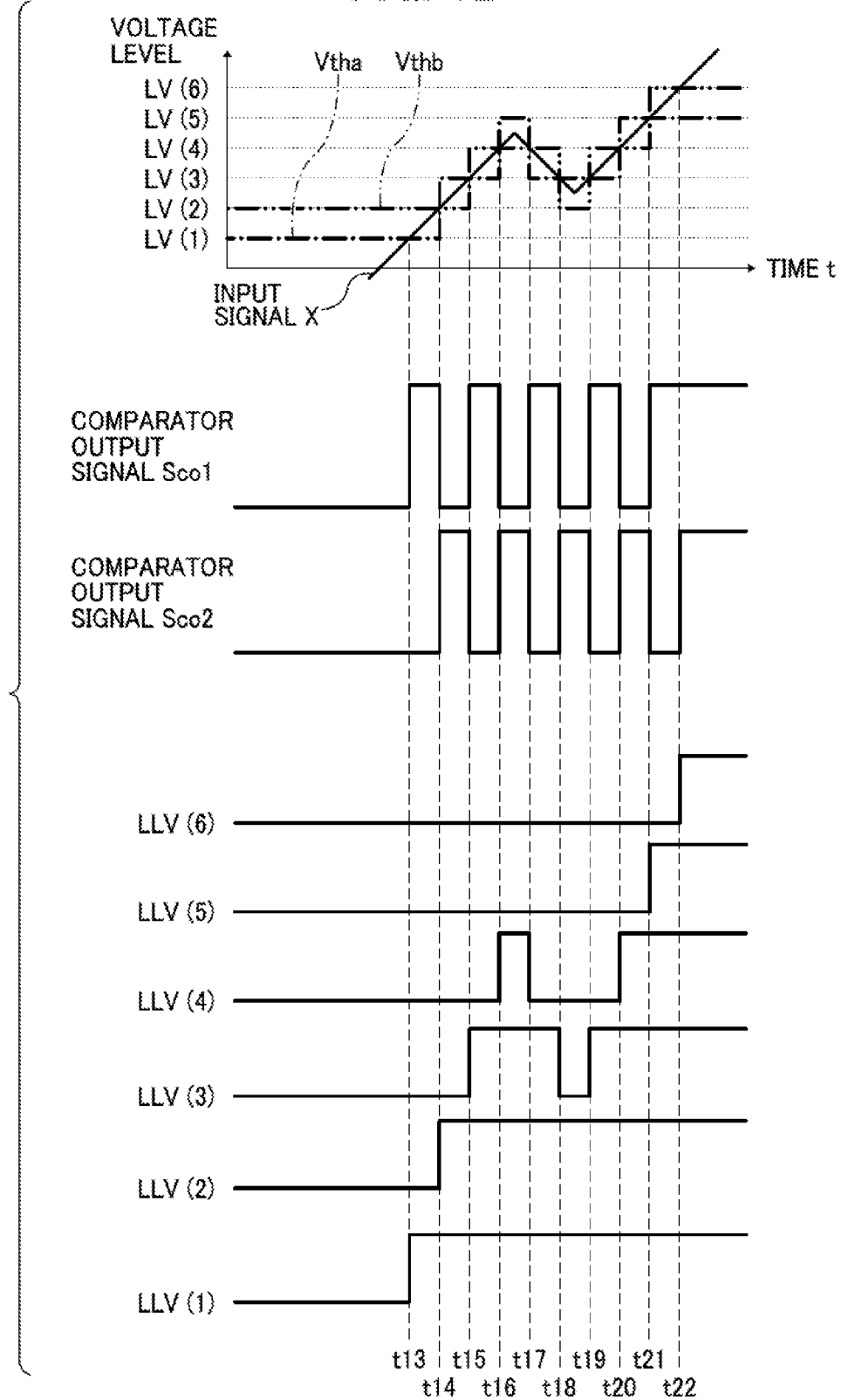
FIG. 12 is a timing diagram for various signals showing a voltage level detection operation by the voltage level detector 1A illustrated in FIG. 10 for an input signal X repeating increase and decrease.

FIG. 11 is a timing diagram for various signals showing a voltage level detection operation by the voltage level detector 1A illustrated in FIG. 10 for an input signal X having a peak value. FIG. 12 is a timing diagram for various signals showing a voltage level detection operation by the voltage level detector 1A illustrated in FIG. 10 for an input signal X repeating increase and decrease. The voltage level detection operation by the voltage level detector 1A is described below with reference to FIGS. 10 to 12.

In FIG. 11, the input signal X is increasing from a voltage level smaller than the threshold level LV(1) to a voltage level greater than the threshold level LV(6), and then decreasing to a voltage level smaller than the threshold level LV(1). The voltage level detector 1A detects the voltage level of the input signal X by switching each of the threshold voltages Vtha and Vthb of the respective comparators 31 and 32 among the multiple threshold levels LV(1) to LV(6) so as to follow the input signal X.

At a time tn (t=1, 2, . . . , 7), the input signal X is increasing. At a time t(2m−1) (m=1, 2, 3), the input signal X exceeds the threshold voltage Vtha of the comparator 31, and the comparator 31 outputs the comparator output signal Sco1 having a high level. In the threshold level switching circuit 5a, the comparison result holding circuit 50a holds the comparator output signal Sco1 having changed to a high level as a holding level signal LLV(2m−1), and outputs it to the encoder 51. The threshold level switching circuit 5a switches the threshold voltage Vthb of the comparator 32 to the threshold level LV(2m) based on the holding level signal LLV(2m−1) having changed to a high level. As a result, the threshold voltage Vthb of the comparator 32 exceeds the voltage level of the input signal X, and the comparator output signal Sco2 reaches a low level.

At a time t(2m), the input signal X exceeds the threshold voltage Vthb of the comparator 32, and the comparator 32 outputs the comparator output signal Sco2 having a high level. The comparison result holding circuit 50a holds the comparator output signal Sco2 having changed to a high level as a holding level signal LLV(2m), and outputs it to the encoder 51. The threshold level switching circuit 5a switches the threshold voltage Vtha of the comparator 31 from the threshold level LV(2m−1) to the threshold level LV(2m+1) based on the holding level signal LLV(2m) having changed to a high level. As a result, the threshold voltage Vtha of the comparator 31 exceeds the voltage level of the input signal X, and the comparator output signal Sco1 reaches a low level.

At a time tn (t=7, 8, . . . , 12), the input signal X is decreasing. Similar to the case where the input signal X is increasing, the voltage level detector 1A detects the input signal X reaching the threshold voltages Vtha and Vthb by the comparators 31 and 32, respectively. In addition, the voltage level detector 1A successively switches the threshold voltages Vtha and Vthb based on the comparator output signals Sco1 and Sco2 having changed to a low level.

As one of the threshold voltages Vtha and Vthb of the comparators 31 and 32 reaches the threshold level, the voltage level detector 1A switches the threshold level of the other. Accordingly, the threshold voltages Vtha and Vthb of the comparators 31 and 32 are set to have threshold levels LV(n) adjacent to each other sandwiching the input signal X. As a result, as shown in FIG. 12, the voltage level detector 1A can detect the voltage level of the input signal X, even it repeats increase and decrease, by following fluctuation of the voltage level.

Figure 13:
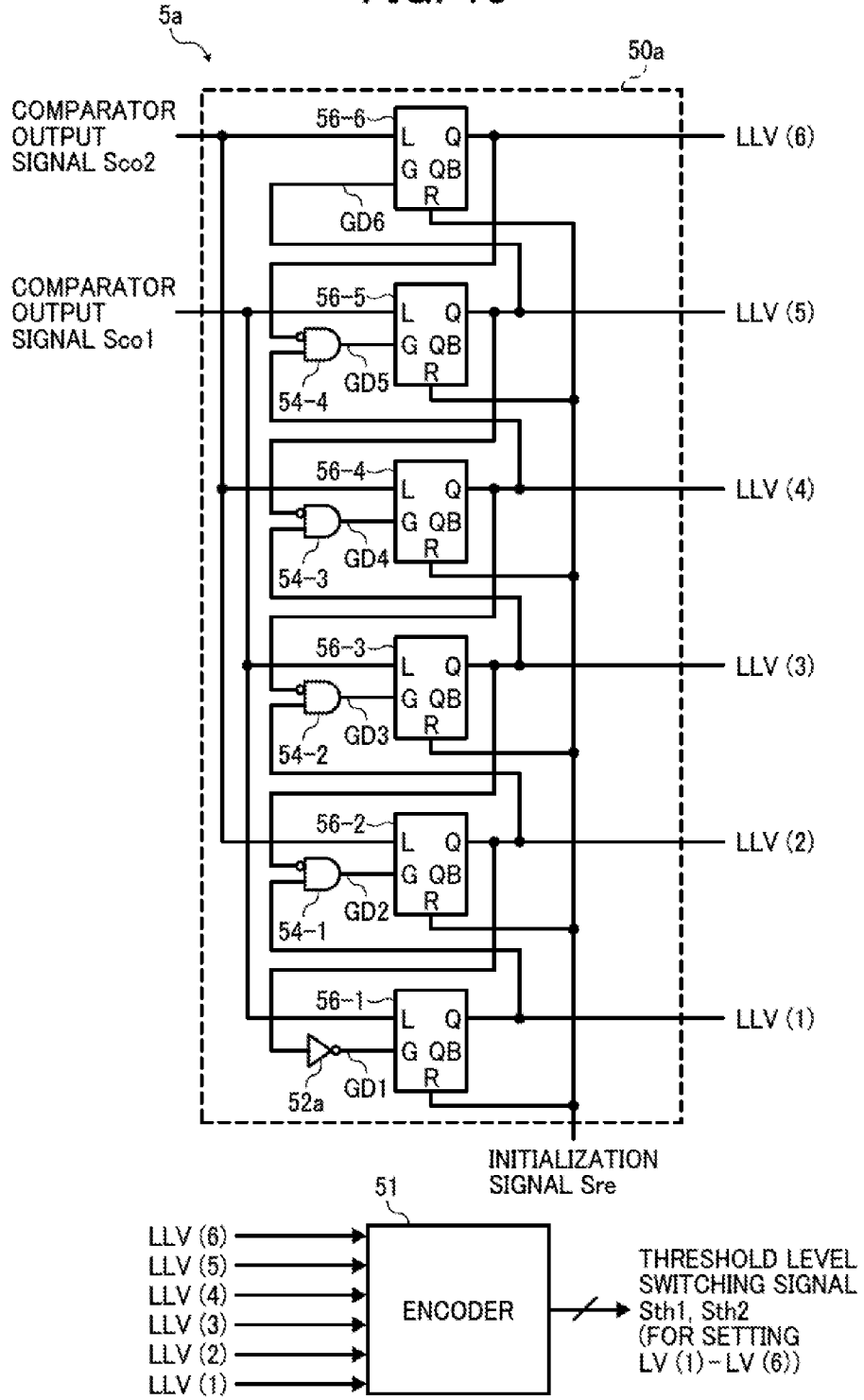
FIG. 13 is a circuit diagram showing the configuration of a threshold level switching circuit 5a when N is 6 in the voltage level detector 1A illustrated in FIG. 10.

FIG. 13 is a circuit diagram showing the configuration of the threshold level switching circuit 5a when N is 6 in the voltage level detector 1A illustrated in FIG. 10. The threshold level switching circuit 5a includes latch circuits 56-$n$ each holding the comparator output signal Sco1 or Sco2 in place of the latch circuits 53-$n$ each holding the comparator output signal Sco included in the threshold level switching circuit 5 illustrated in FIG. 4. The difference therebetween is described below.

Referring to FIG. 13, the comparator output signal Sco1 from the comparator 31 illustrated in FIG. 10 is input to the latch circuit 56-(2$m$−1), and the comparator output signal Sco2 from the comparator 32 illustrated in FIG. 10 is input to the latch circuit 56-2$m$ ($m$=1, 2, 3). The latch circuit 56-1 captures the comparator output signal Sco1 according to the gate signal GD1 from the NOT gate 52a that inverts the holding level signal LLV(2), and outputs it to the encoder 51 as the holding level signal LLV(1). The logical gate 54-($n$−1) ($n$=2, 3, . . . , 5) performs an operation of a logical AND of an inversion signal of the holding level signal LLV($n$+1) and the holding level signal LLV($n$−1), and outputs the gate signal GD$n$ indicating the operation result to the latch circuit 56-$n$. The latch circuit 56-$n$ captures the comparator output signal Sco1 or Sco2 according to the gate signal GD$n$, and outputs it to the encoder 51 as the holding level signal LLV($n$).

Figure 14:
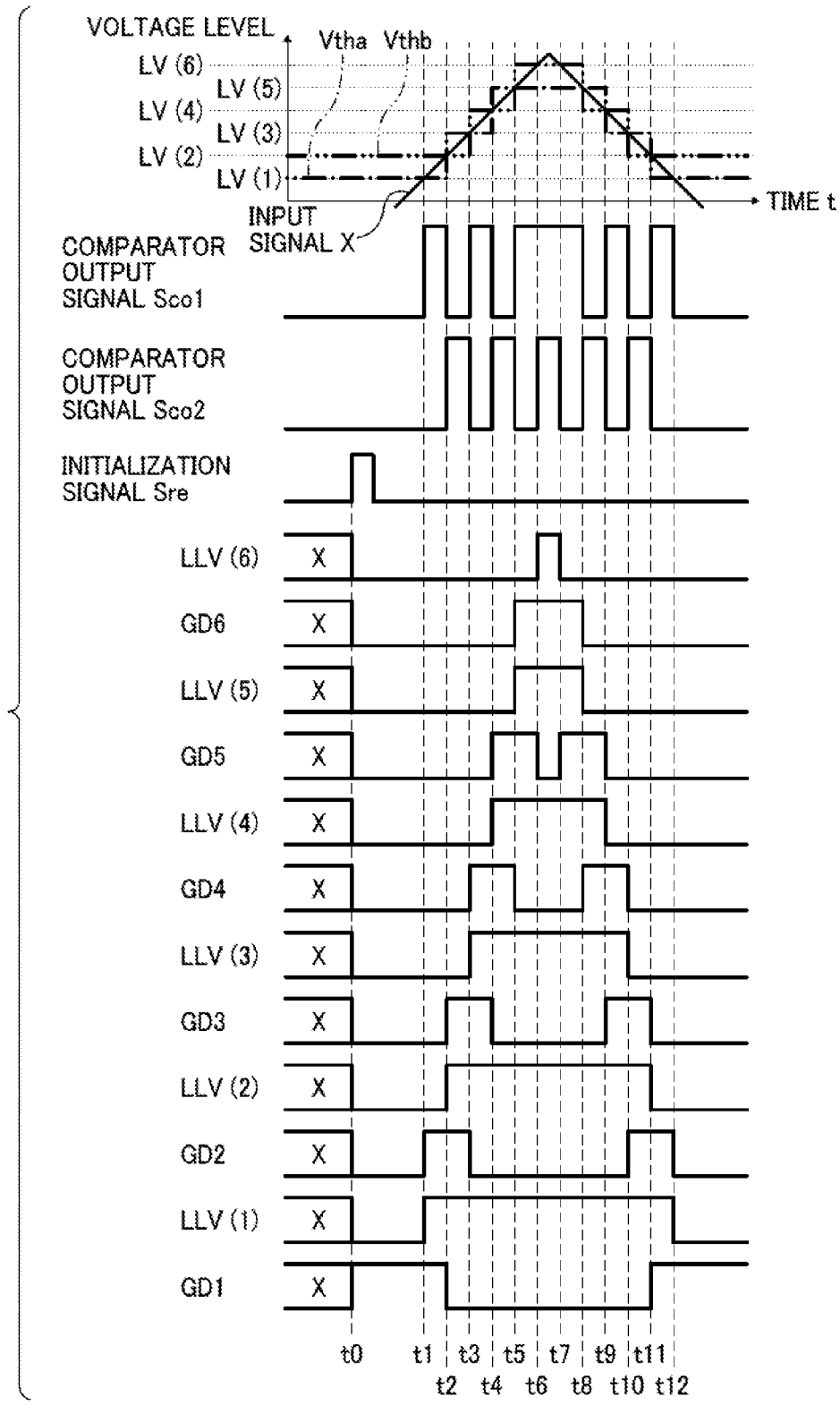
FIG. 14 is a timing diagram for various signals showing an operation by the threshold level switching circuit 5a illustrated in FIG. 13.

FIG. 14 is a timing diagram for various signals showing an operation by the threshold level switching circuit 5a illustrated in FIG. 13.

In FIG. 14, the latch circuits 56-1 to 56-6 are successively put into a state of being capable of capturing signals according to the holding level signals LLV(1) to LLV(6). At a time t(2$m$−1) ($m$=1, 2, 3), the comparison result holding circuit 50a captures the comparator output signal Sco1 having changed to a high level into the latch circuit 56-(2$m$−1), and holds it as a holding level signal LLV(2$m$−1). The holding level signal LLV(2$m$−1) having changed to a high level makes it possible to detect the input signal X exceeding the threshold level LV(2$m$−1). The gate signal GD(2$m$) reaches a high level according to the changed holding level signal LLV(2$m$−1), and the latch circuit 56-2$m$ is switched to a state of being capable of capturing signals.

Similarly, at a time t(2$m$), the comparison result holding circuit 50a captures the comparator output signal Sco2 having changed to a high level into the latch circuit 56-2$m$, and holds it as a holding level signal LLV(2$m$). According to the changed holding level signal LLV(2$m$), the latch circuits 56-2$m$ and 56-(2$m$+1) are put into a state of being capable of capturing signals. Similarly, at a time t$n$ ($n$=7, 8, . . . , 12), two of the latch circuits 56-1 to 56-6 adjacent to each other are successively put into a state of being capable of capturing signals according to the holding level signals LLV(1) to LLV(6).

The comparator output signals Sco1 and Sco2 are successively captured according to the latch circuits 56-$n$, and the input signal X is compared with each of the two threshold voltages Vtha and Vthb. Accordingly, it is possible to detect the voltage level according to increase and decrease of the input signal X.

In accordance with the above-described embodiment (Embodiment 2) of the present invention, the voltage level detector 1A includes the multiple comparators 31 and 32 and the threshold level switching circuit 5a. The comparators 31 and 32 each have multiple threshold voltages Vtha and Vthb, respectively, different from each other. The comparators 31 and 32 each compare the voltage level of the input signal X that changes in a continuous manner with the respective threshold voltages Vtha and Vthb, and generate and output the respective comparator output signals Sco1 and Sco2 indicating that the input signal X has reached the respective threshold voltages Vtha and Vthb. The threshold level switching circuit 5a changes the threshold voltages Vtha and Vthb of the respective comparators 31 and 32 based on the respective comparator output signals Sco1 and Sco2. The threshold level switching circuit 5a raises the threshold voltage Vtha of the comparator 31 from the threshold level LV(2$m$−1) to the threshold level LV(2$m$+1) when the input signal X has increased to reach the threshold level LV(2$m$) of the comparator 32. The threshold level switching circuit 5a lowers the threshold voltage Vtha of the comparator 31 from the threshold level LV(2$m$+1) to the threshold level LV(2$m$−1) when the input signal X has decreased to reach the threshold level LV(2$m$) of the comparator 32.

Accordingly, it is possible to detect the voltage level of the input signal X reaching the upper and lower limits of the threshold levels by use of the multiple comparators 31 and 32. This makes it possible to detect the voltage level with a reduced circuit area.

Detection accuracy of the voltage level of the input signal X can be improved by increasing the number N of threshold levels LV(1) to LV(N) set for the threshold voltages Vtha and Vthb of the respective comparators 31 and 32. Detection range of the voltage level of the input signal X can be broadened by broadening the width between the upper and lower limits of the threshold level LV($n$) set for the threshold voltages Vtha and Vthb of the respective comparators 31 and 32.

Modification 1 of Embodiment 2

Figure 15:
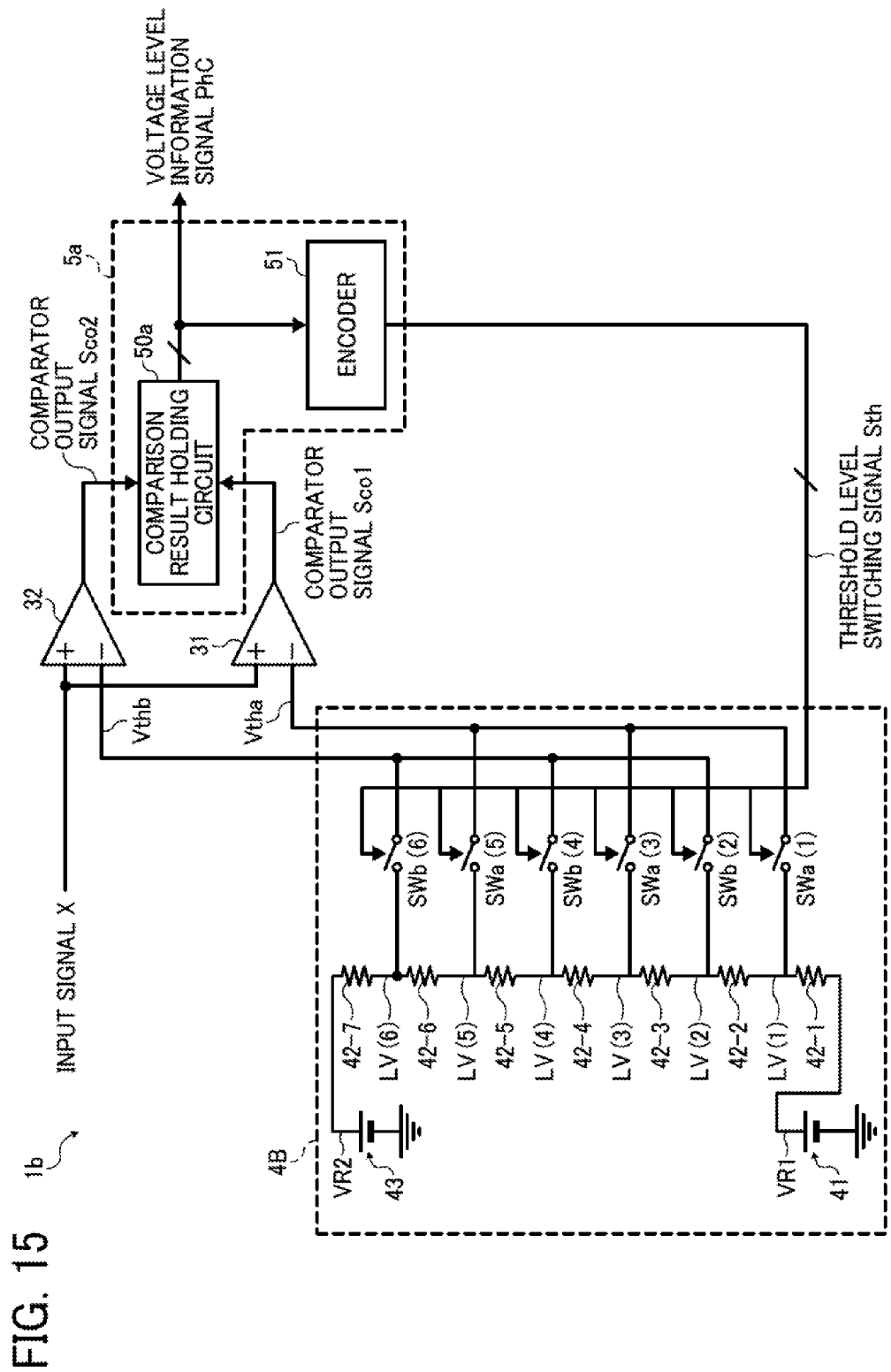
FIG. 15 is a block diagram showing the configuration of a voltage level detector 1b in accordance with another embodiment (Modification 1 of Embodiment 2) of the present invention.

FIG. 15 is a block diagram showing the configuration of a voltage level detector 1b in accordance with another embodiment (Modification 1 of Embodiment 2) of the present invention. In the present embodiment (Modification 1 of Embodiment 2), the voltage level detector 1b includes a threshold level generation circuit 4B in place of the variable voltage sources 4a and 4b included in the voltage level detector 1a according to Embodiment 2. Compared to the threshold level generation circuit 4A illustrated in FIG. 9, the threshold level generation circuit 4B according to the present embodiment (Modification 1 of Embodiment 2) outputs threshold levels LV(2$m$±1) and LV(2$m$) to the respective comparators 31 and 32. The difference therebetween is described below.

Referring to FIG. 15, the threshold level generation circuit 4B includes switches SWa(2$m$−1) and SWb(2$m$) in place of the switches SW(2$m$−1) and SW(2$m$), respectively, included in the threshold level generation circuit 4A illustrated in FIG. 9. The difference therebetween is described below.

Referring to FIG. 15, the switches SWa(2$m$−1) are connected to the comparator 31 and on-off controlled by the threshold level switching signal Sth from the encoder 51 in such a manner that only one of the switches SWa(2$m$−1) is turned on. The switches SWb(2$m$) are connected to the comparator 32 and on-off controlled by the threshold level switching signal Sth from the encoder 51 in such a manner that only one of the switches SWb(2$m$) is turned on.

The threshold level switching signal Sth turns only the switches SWa(2$m$−1) and SWb(2$m$) on according to the holding level signals LLV(1) to LLV(2$m$−1) having a high level and the holding level signals LLV(2$m$) to LLV(6)

having a low level. The threshold level switching signal Sth turns only the switches SWa(2m+1) and SWb(2m) on according to the holding level signals LLV(1) to LLV(2m) having a high level and the holding level signals LLV(2m+1) to LLV(6) having a low level. Thus, the threshold level generation circuit 4B can switch the threshold levels LV(2m±1) and LV(2m) respectively output to the comparators 31 and 32.

Modification 2 of Embodiment 2

Figure 16:
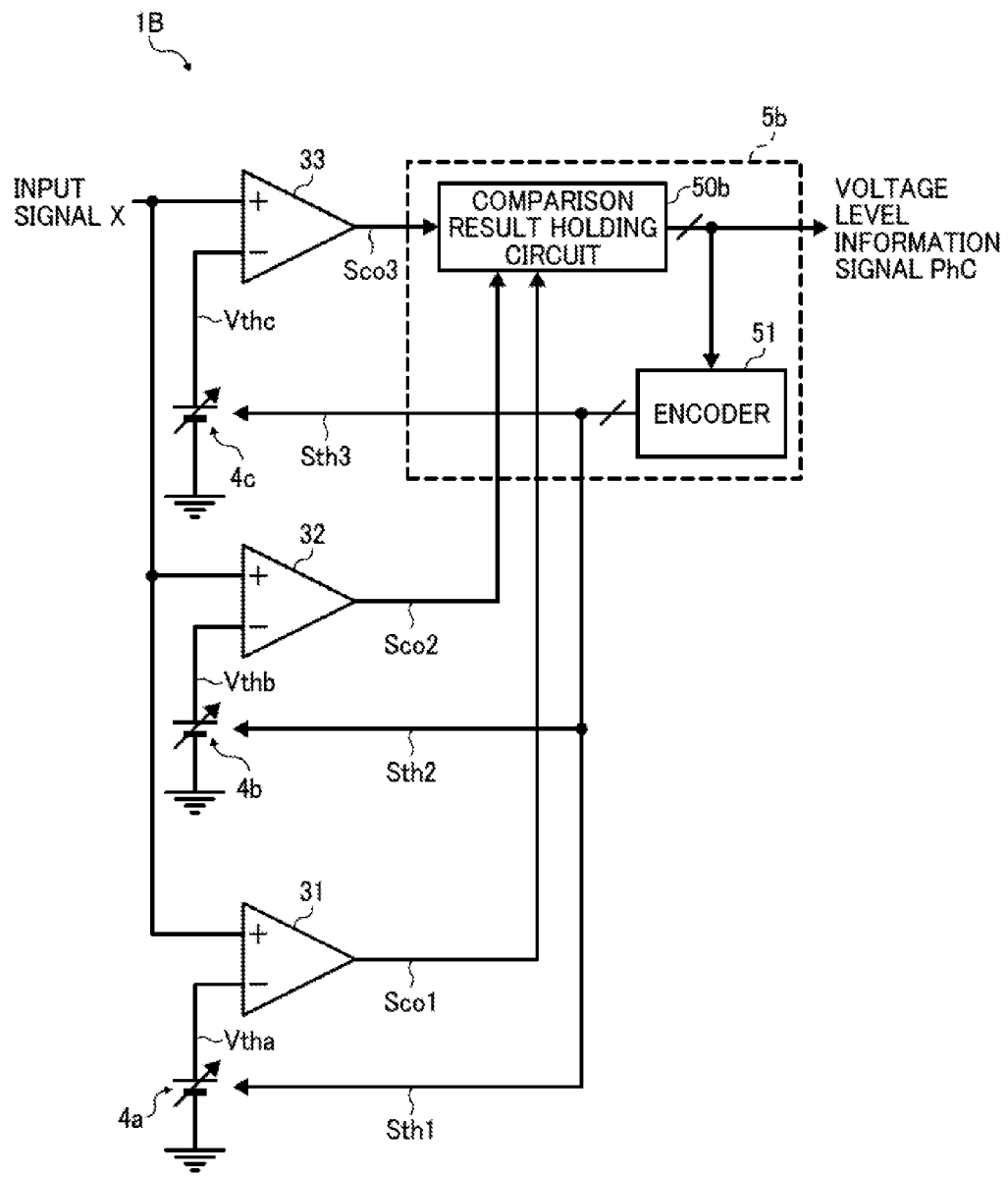
FIG. 16 is a block diagram showing the configuration of a voltage level detector 1B in accordance with another embodiment (Modification 2 of Embodiment 2) of the present invention.

FIG. 16 is a block diagram showing the configuration of a voltage level detector 1B in accordance with another embodiment (Modification 2 of Embodiment 2) of the present invention. In Embodiment 2, two comparators 31 and 32 are used, however, the number of comparators is not limited thereto. The voltage level detector 1B detects the voltage level of the input signal using three comparators. By using three comparators, it is possible to detect the voltage level of an input signal having a greater fluctuation velocity. The difference therebetween is described below.

Referring to FIG. 16, the voltage level detector 1B according to Modification 2 of Embodiment 2 further includes a comparator 33 and a variable voltage source 4c compared to the voltage level detector 1A. In addition, the voltage level detector 1B includes a threshold level switching circuit 5b in place of the threshold level switching circuit 5a included in the voltage level detector 1A. The threshold level switching circuit 5b includes a comparison result holding circuit 50b. The variable voltage source 4c applies a threshold voltage Vthc to an inversion input terminal of the comparator 33. The comparator 33 compares the input signal X with the threshold voltage Vthc, and outputs a comparator output signal Sco3 indicating a comparison result to the comparison result holding circuit 50b.

Figure 17:
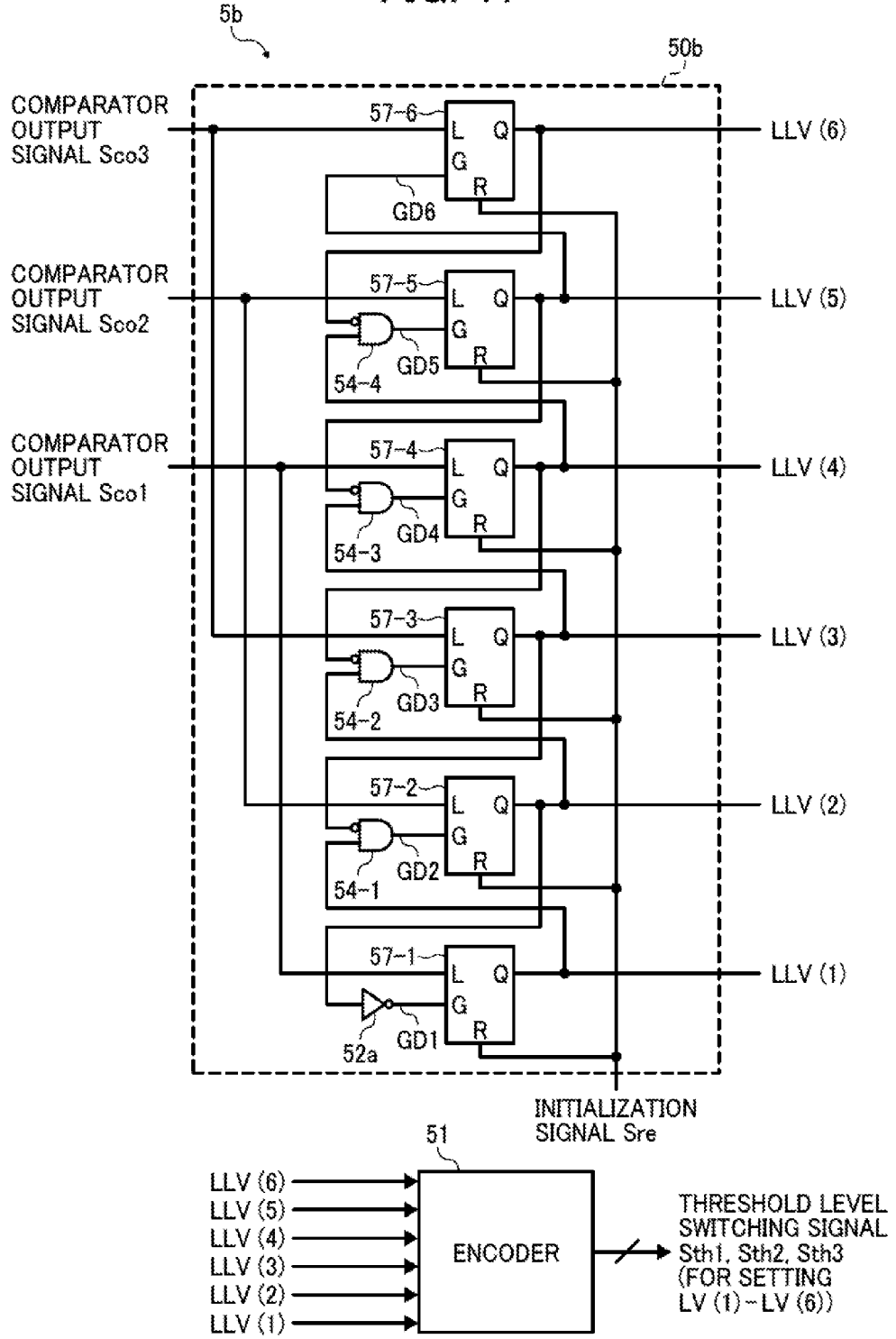
FIG. 17 is a circuit diagram showing the configuration of a threshold level switching circuit 5b when N is 6 in the voltage level detector 1B illustrated in FIG. 16.

FIG. 17 is a circuit diagram showing the configuration of the threshold level switching circuit 5b when N is 6 in the voltage level detector 1B illustrated in FIG. 16. Referring to FIG. 17, similar to FIG. 13, the threshold level switching circuit 5b includes latch circuits 57-n each holding the comparator output signal Sco1, Sco2, or Sco3 from the respective comparators 31, 32, and 33 illustrated in FIG. 16. The comparator output signal Sco1 from the comparator 31 is input to the latch circuit 56-(3m−2), and the comparator output signal Sco2 from the comparator 32 is input to the latch circuit 56-(3m−1) (m=1, 2). The comparator output signal Sco3 from the comparator 33 is input to the latch circuit 56-3m. Each of the latch circuits 57-n (n=1, 2, . . . , 6) is corresponding to each of the threshold levels LV(n). Each of the latch circuits 57-n captures the comparator output signal Sco1, Sco2, or Sco3 at a predetermined timing to hold it as the holding level signal LLV(n).

Figure 18:
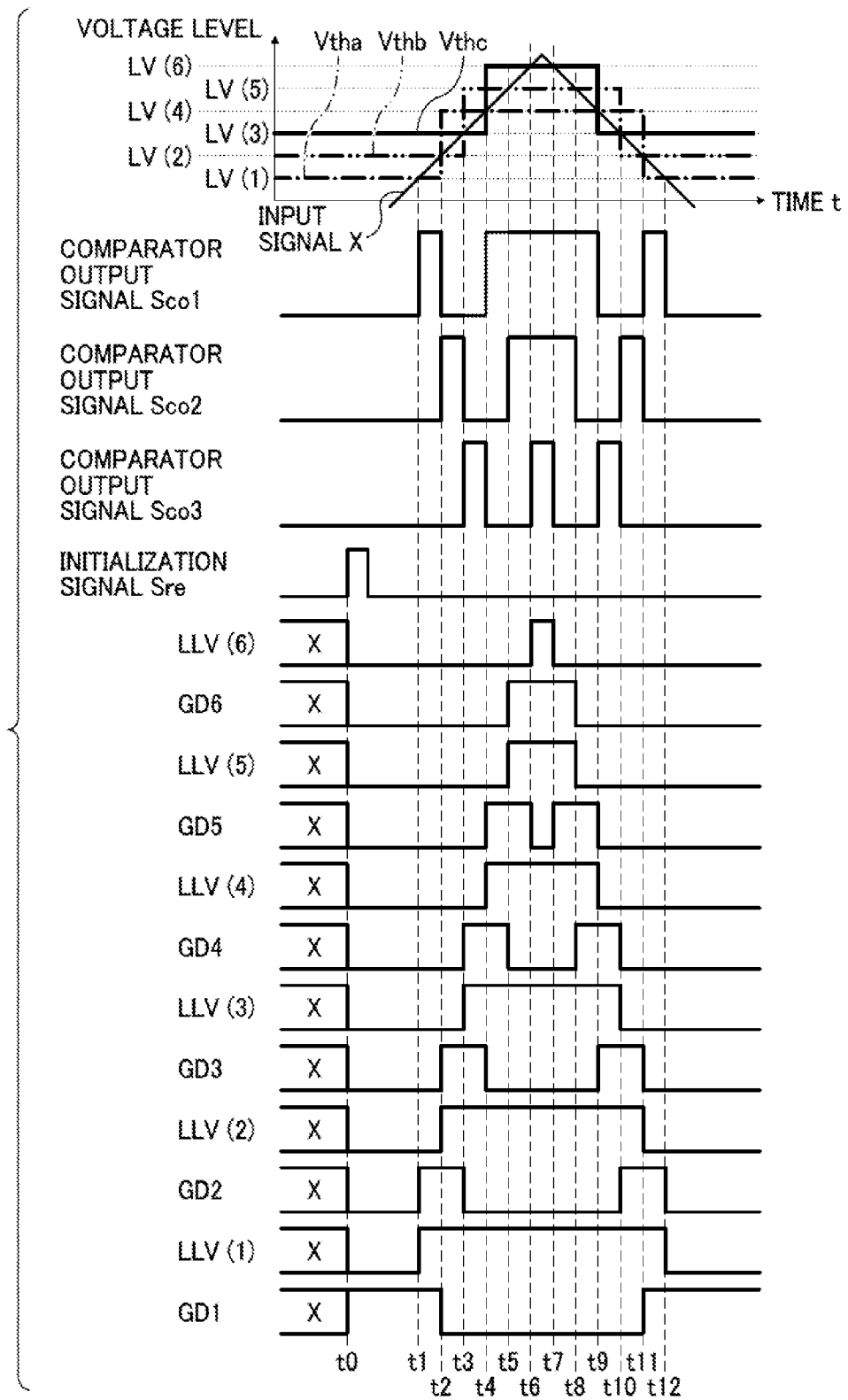
FIG. 18 is a timing diagram for various signals showing an operation by the threshold level switching circuit 5b illustrated in FIG. 17.

FIG. 18 is a timing diagram for various signals showing an operation by the threshold level switching circuit 5b illustrated in FIG. 17. During the voltage level detection operation by the voltage level detector 1B, the threshold level switching circuit 5b switches the threshold voltages Vtha, Vthb, and Vthc of the respective comparators 31, 32, and 33 so as to follow the input signal X.

Referring to FIG. 18, the input signal X is increasing at a time tn (t=1, 2, . . . , 7). At a time t(3m−2) (m=1, 2), the input signal X exceeds the threshold voltage Vtha of the comparator 31, and the comparator 31 outputs the comparator output signal Sco1 having a high level. The threshold level switching circuit 5b holds the comparator output signal Sco1 having changed to a high level as a holding level signal LLV(3m−2), and sets the threshold voltage Vthb of the comparator 32 to a threshold level LV(3m−1).

At a time t(3m−1), the input signal X exceeds the threshold voltage Vthb of the comparator 32, and the comparator 32 outputs the comparator output signal Sco2 having a high level. The threshold level switching circuit 5b holds the comparator output signal Sco2 having changed to a high level as a holding level signal LLV(3m−1), and sets the threshold voltage Vthc of the comparator 33 to a threshold level LV(3m).

At a time t(3m), the input signal X exceeds the threshold voltage Vthc of the comparator 33, and the comparator 33 outputs the comparator output signal Sco3 having a high level. The threshold level switching circuit 5b holds the comparator output signal Sco3 having changed to a high level as a holding level signal LLV(3m), and sets the threshold voltage Vtha of the comparator 31 as a threshold level LV(3m+1).

At a time tn (t=7, 8, . . . , 12), the input signal X is decreasing. Similar to the case where the input signal X is increasing, the threshold level switching circuit 5b successively switches the threshold voltages Vtha, Vthb, and Vthc of the respective comparators 31, 32, and 33 based on the respective comparator output signals Sco1, Sco2, and Sco3 having changed to a low level.

As one of the threshold voltages Vtha, Vthb, and Vthc of the respective comparators 31, 32, and 33 reaches the threshold level, the voltage level detector 1b switches the threshold level of one of the remaining threshold voltages. At this time, it is possible to compare the remaining one threshold voltage with the input signal X. This makes it possible to obtain a margin of settling period in switching the threshold level LV(n). Accordingly, it is much easier to follow the voltage level of the input signal X, thereby improving detection accuracy.

Modification 3 of Embodiment 2

Figure 19:
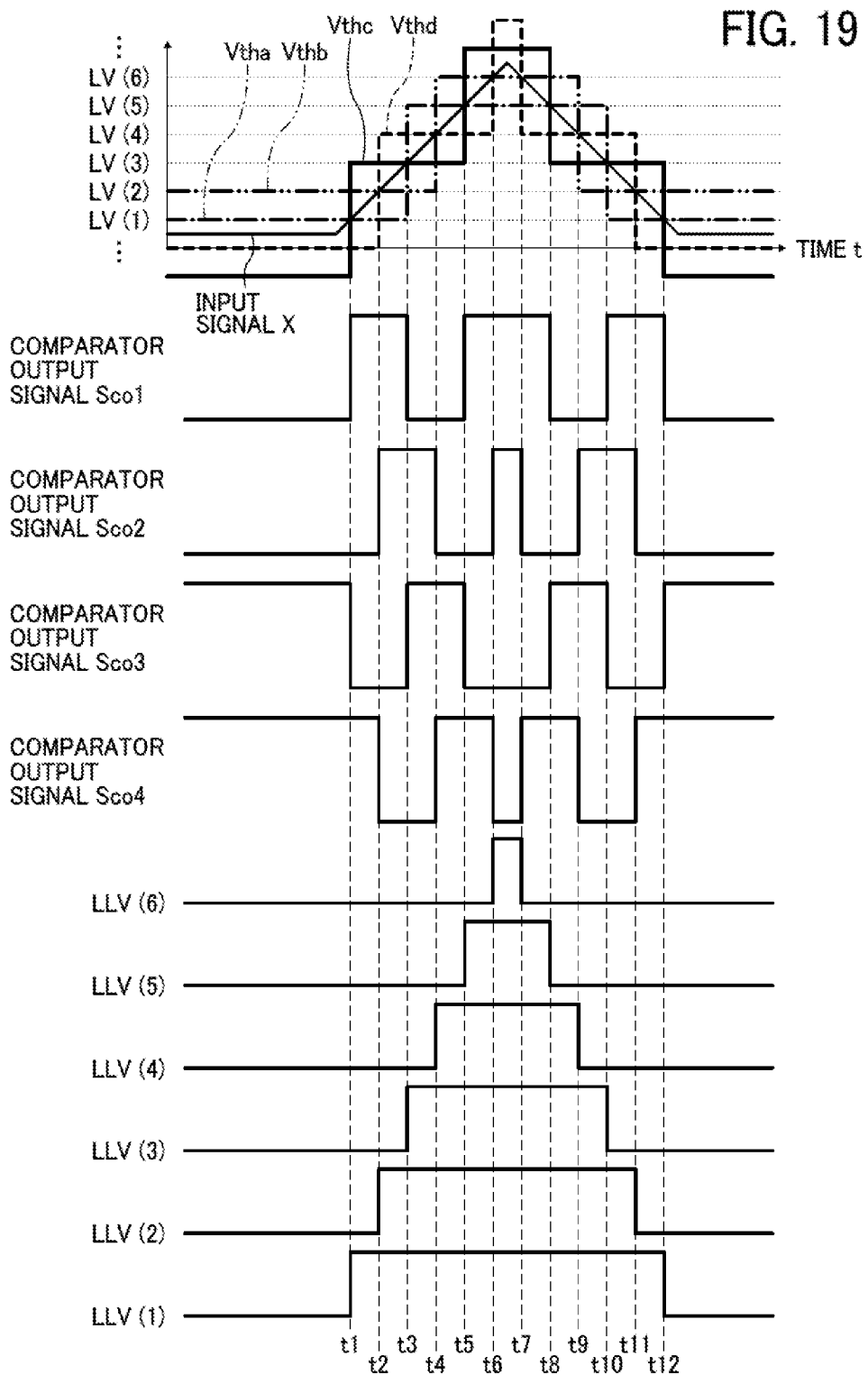
FIG. 19 is a timing diagram for various signals showing a voltage level detection operation in accordance with another embodiment (Modification 3 of Embodiment 2) of the present invention.

FIG. 19 is a timing diagram for various signals showing a voltage level detection operation according to another embodiment (Modification 3 of Embodiment 2). FIG. 19 shows the voltage level detection operation by a voltage level detector having four comparators.

In the voltage level detection operation illustrated in FIG. 19, the threshold levels of two of the threshold voltages Vtha to Vthd are switched to be greater than the input signal X, and the threshold levels of the remaining two of them are switched to be smaller than the input signal X. Thus, it is possible to detect the input signal X reaching the upper or lower limit threshold level even during a period when one of the threshold voltages Vtha to Vthd is switched. The number of voltage level detectors is not limited to 2 to 4. Any number of multiple voltage level detectors can be used.

Embodiment 3

Figure 20:
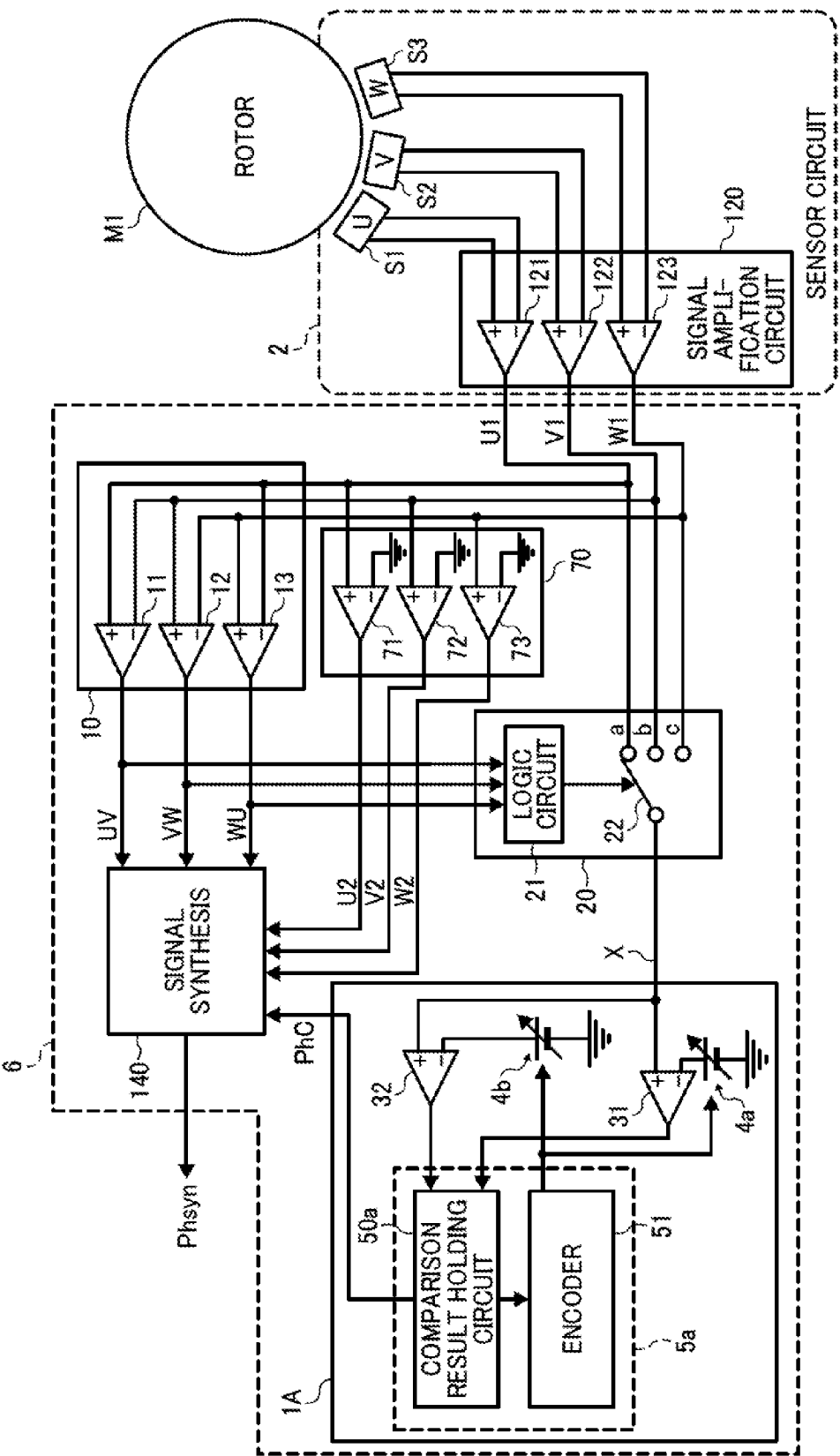
FIG. 20 is a block diagram showing the configuration of a phase information detector 6 along with a motor M1 and a sensor circuit 2 in accordance with another embodiment (Embodiment 3) of the present invention.

FIG. 20 is a block diagram showing the configuration of a phase information detector 6 along with a motor M1 and a sensor circuit 2 in accordance with an embodiment of the present invention. The voltage level detectors according to Embodiments 1 and 2 and Modifications thereof can be used as a phase information detector for detecting, for example, rotation phase of a motor. In the present embodiment, the phase information detector 6 utilizes the voltage level detector 1A according to Embodiment 2.

Referring to FIG. 20, the phase information detector 6 includes an intersection phase detection circuit 10, a signal selection circuit 20, a zero-cross phase detection circuit 70, the voltage level detector 1A, and a signal synthesis circuit 140. The intersection phase detection circuit 10 includes three comparators 11 to 13. The signal selection circuit 20 includes a logic circuit 21 and a switch 22. The zero-cross phase detection circuit 70 includes three comparators 71 to 73.

Referring to FIG. 20, the motor M1 is composed of, for example, a brushless DC motor. The sensor circuit 2 is disposed on the periphery of a rotor of the motor M1. The sensor circuit 2 includes sensors S1 to S3 and a signal amplification circuit 120. The signal amplification circuit 120 includes three differential amplifiers 121 to 123. In the sensor circuit 2, the sensors S1 to S3 detect respective rotation angles of U phase, V phase, and W phase of the motor M1 that are set at a predetermined electrical angle interval (e.g., 120°). Each of the sensors S1 to S3 is a magnetic sensor composed of, for example, a Hall element, that detects magnetic flux density fluctuating according to rotation of the motor M1. In the sensor circuit 2, the sensors S1, S2, and S3 generate detection signals of the magnetic flux densities for the U phase, V phase, and W phase and their reverse phase signals, respectively, and input them to the signal amplification circuit 120.

In the signal amplification circuit 120, the differential amplifier 121 differentially amplifies the detection signal and its reverse phase signal from the sensor S1 to generate a sensor signal U1 indicating the differential amplification result. The differential amplifier 122 differentially amplifies the detection signal and its reverse phase signal from the sensor S2 to generate a sensor signal V1 indicating the differential amplification result. The differential amplifier 123 differentially amplifies the detection signal and its reverse phase signal from the sensor S3 to generate a sensor signal W1 indicating the differential amplification result. The signal amplification circuit 120 outputs the sensor signals U1, V1, and W1 to the intersection phase detection circuit 10, the zero-cross phase detection circuit 70, and the signal selection circuit 20.

In the zero-cross phase detection circuit 70, the comparator 71 compares the signal level of the sensor signal U1 with a zero-cross level. When the sensor signal U1 is equal to or greater than the zero-cross level, the comparator 71 generates a phase detection signal U2 having a high level. When the sensor signal U1 is less than the zero-cross level, the comparator 71 generates a phase detection signal U2 having a low level. Similarly, the comparator 72 compares the signal level of the sensor signal V1 with the zero-cross level and generates a phase detection signal V2 indicating the comparison result. The comparator 73 compares the signal level of the sensor signal W1 with the zero-cross level and generates a phase detection signal W2 indicating the comparison result. The comparators 71 to 73 of the zero-cross phase detection circuit 70 output the phase detection signals U2, V2, and W2 to the signal synthesis circuit 140.

In the intersection phase detection circuit 10, the comparator 11 compares the signal level of the sensor signal U1 with the sensor signal V1, and generates an intersection phase detection signal UV indicating the phase (timing) of the intersection of the sensor signals U1 and V1. Similar to the comparator 11, the comparator 12 compares the sensor signals V1 and W1 and generates an intersection phase detection signal VW indicating the phase of the intersection of the sensor signals V1 and W1. Similar to the comparator 11, the comparator 13 compares the sensor signals W1 and U1 and generates an intersection phase detection signal WU indicating the phase of the intersection of the sensor signals W1 and U1.

FIG. 21 is a table showing the intersection phase detection signals UV, VW, and WU indicating the comparison results for the sensor signals U1, V1, and W1 by the intersection phase detection circuit 10 illustrated in FIG. 20. As shown in FIG. 21, when the signal level of the sensor signal U1 is equal to or greater than that of the sensor signal V1, the comparator 11 illustrated in FIG. 20 generates the intersection phase detection signal UV having a high level (Hi). When the signal level of the sensor signal U1 is less than that of the sensor signal V1, the comparator 11 generates the intersection phase detection signal UV having a low level (Low). Similar to the comparator 11, each of the comparators 12 and 13 illustrated in FIG. 20 generates the two-valued intersection phase detection signal VW and WU, respectively, according to FIG. 21. The intersection phase detection circuit 10 compares each of the sensor signals U1, V1, and W1 with another and generates the intersection phase detection signals UV, VW, and WU indicating the phase of the intersection of each pair of the sensor signal. The comparators 11 to 13 of the intersection phase detection circuit 10 output the intersection phase detection signals UV, VW, and WU to the signal selection circuit 20 and the signal synthesis circuit 140.

FIG. 22 is a table showing signal selection conditions for the signal selection circuit 20 illustrated in FIG. 20. In the signal selection circuit 20 illustrated in FIG. 20, the sensor signals U1, V1, and W1 are input to respective terminals a, b, and c of the switch 22. The logic circuit 21 switching-controls the terminals a, b, and c of the switch 22 based on the intersection phase detection signals UV, VW, and WU. According to the input conditions of the intersection phase detection signals UV, VW, and WU illustrated in FIG. 22, the signal selection circuit 20 illustrated in FIG. 20 outputs a selection signal X that is one selected from the sensor signals U1, V1, and W1 to the voltage level detector 1A.

In the voltage level detector 1A, the threshold levels LV(1) to LV(N) of the threshold voltages Vtha and Vthb are set corresponding to predetermined phases of the rotor of the motor M1. The voltage level detector 1A detects the signal level of the selection signal X reaching multiple threshold levels corresponding to predetermined phases of the rotor of the motor M1 by making the threshold voltages Vtha and Vthb of the comparators 31 and 32 follow the selection signal X. The voltage level detector 1A outputs the voltage level information signal PhC as a phase information signal indicating rotation of the motor M1 by a predetermined angle.

The signal synthesis circuit 140 outputs a phase information signal Phsyn that is a toggle signal synthesized by exclusive OR based on the phase information signal PhC, the intersection phase detection signals UV, VW, and WU, and the sensor signals U2, V2, and W2.

In the phase information detector 6 having the configuration as described above, the phase information of the rotor of the motor M1 can be detected based on the sensor signals U1, V1, and W1 as follows.

Figure 23:
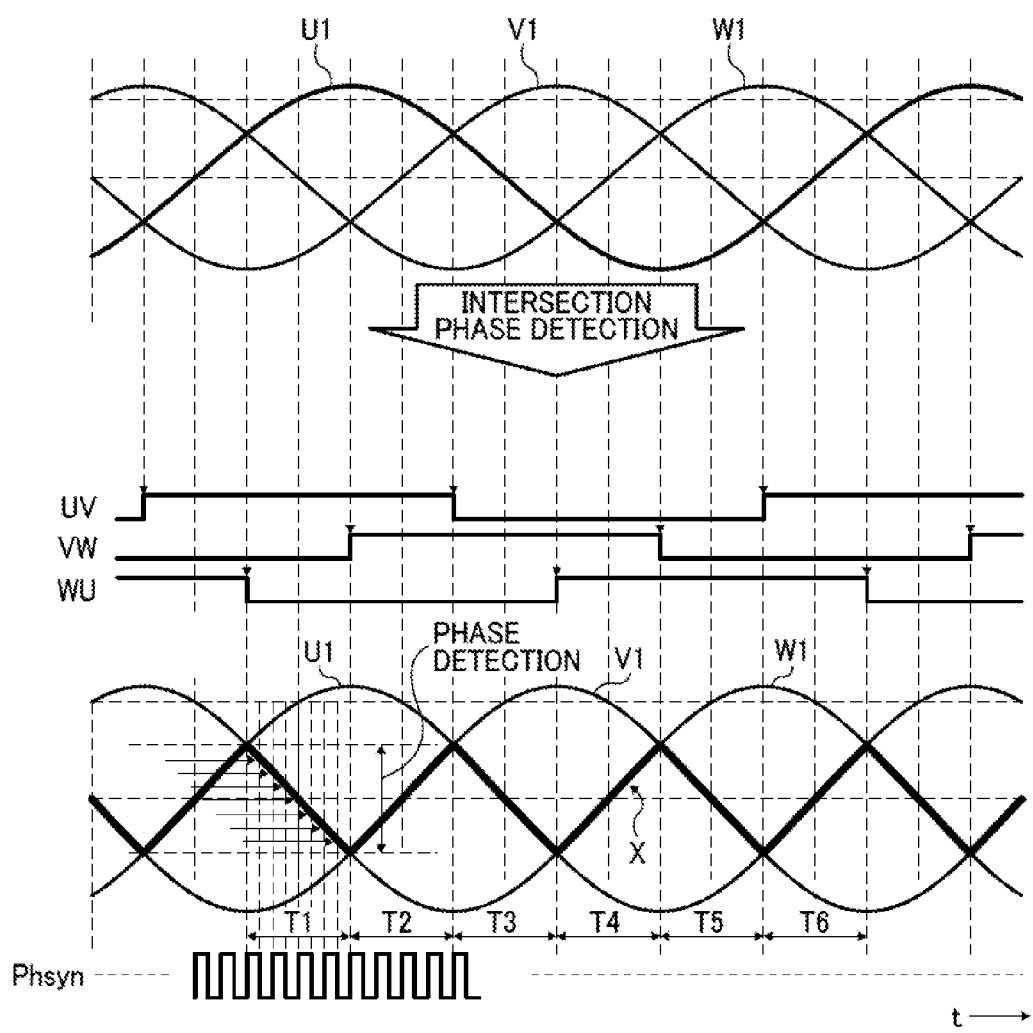
FIG. 23 is a timing diagram for various signals showing an operation state of the phase information detector 6 illustrated in FIG. 20.

FIG. 23 is a timing diagram for various signals showing an operation state of the phase information detector 6 illustrated in FIG. 20. In FIG. 23, the sensor signals U1, V1, and W1 from the respective sensors S1, S2, and S3 are each represented by sine wave (which may be replaced with other types of waveform substantially equivalent to sine wave). The U phase, V phase, and W phase of the sensors S1 to S3 are set at an electrical angle interval of 120°.

By use of the intersection phase detection circuit 10, the intersection phase detection signals UV, VW, and WU are obtained as comparison results with the sensor signals U1, V1, and W1 as shown in FIG. 21. According to the input conditions shown in FIG. 22, the signal selection circuit 20 selects one of the sensor signals U1, V1, and W1 to obtain the selection signal X for every phase interval between intersections among the sensor signals U1, V1, and W1. The selection signals X thus obtained are connecting to each other, forming a continuous signal in terms of time as shown by thick lines in a lower part of FIG. 23.

As shown in FIG. 22, the selection signal X is composed of 60°-interval periods where the sine wave phase ranges from −30° to 30° and other 60°-interval periods where the sine wave phase ranges from 150° to 210°. The selection signal X shows higher linearity in the above 60°-interval periods compared to other 60°-interval periods where the sine wave phase ranges from 30° to 90°, 90° to 150°, 210° to 270°, or 270° to 310°. Referring to FIG. 23, horizontal arrows directed to the selection signal X indicate the predetermined threshold levels LV(n). The phase information detector 6 detects the selection signal X reaching a predetermined threshold level and switches the phase information signal Phsyn between two values.

In the phase information detector according to Embodiment 3, the phase of the motor M1 can be detected based on the sensor signals U1, V1, and W1 from the sensors S1 to S3. As the voltage level detector 1A detects the signal level of the sensor signals U1, V1, and W1 within the phase interval periods where the linearity of the signals is high, the accuracy of rotation phase detection can be more enhanced.

Embodiment 4

Figure 24:
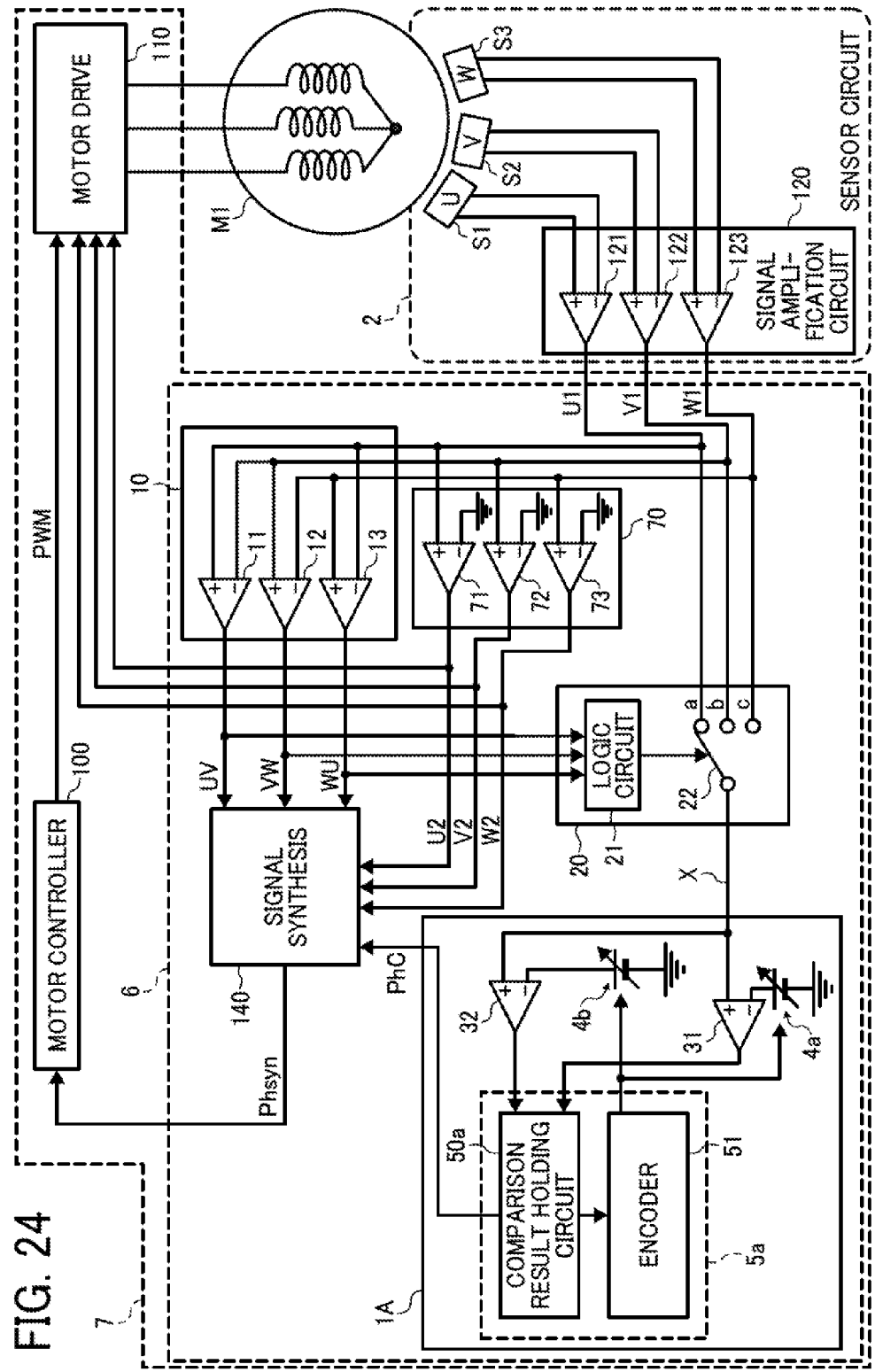
FIG. 24 is a block diagram showing the configuration of a motor apparatus in accordance with another embodiment (Embodiment 4) of the present invention.

FIG. 24 is a block diagram showing the configuration of a motor apparatus in accordance with another embodiment (Embodiment 4) of the present invention. Referring to FIG. 24, the motor apparatus according to Embodiment 4 includes the motor M1, the sensor circuit 2, and a motor drive controller 7. The motor drive controller 7 includes the phase information detector 6 according to Embodiment 3, a motor controller 100, and a motor driver 110. The motor controller 100 generates a pulse-width modulation (PWM) signal based on the phase information signal Phsyn and outputs it to the motor driver 110. The motor driver 110 rotary-drives the rotor of the motor M1 by flowing driving current in multiple motor coils selectively based on the PWM signal from the motor controller 100.

Figure 25:
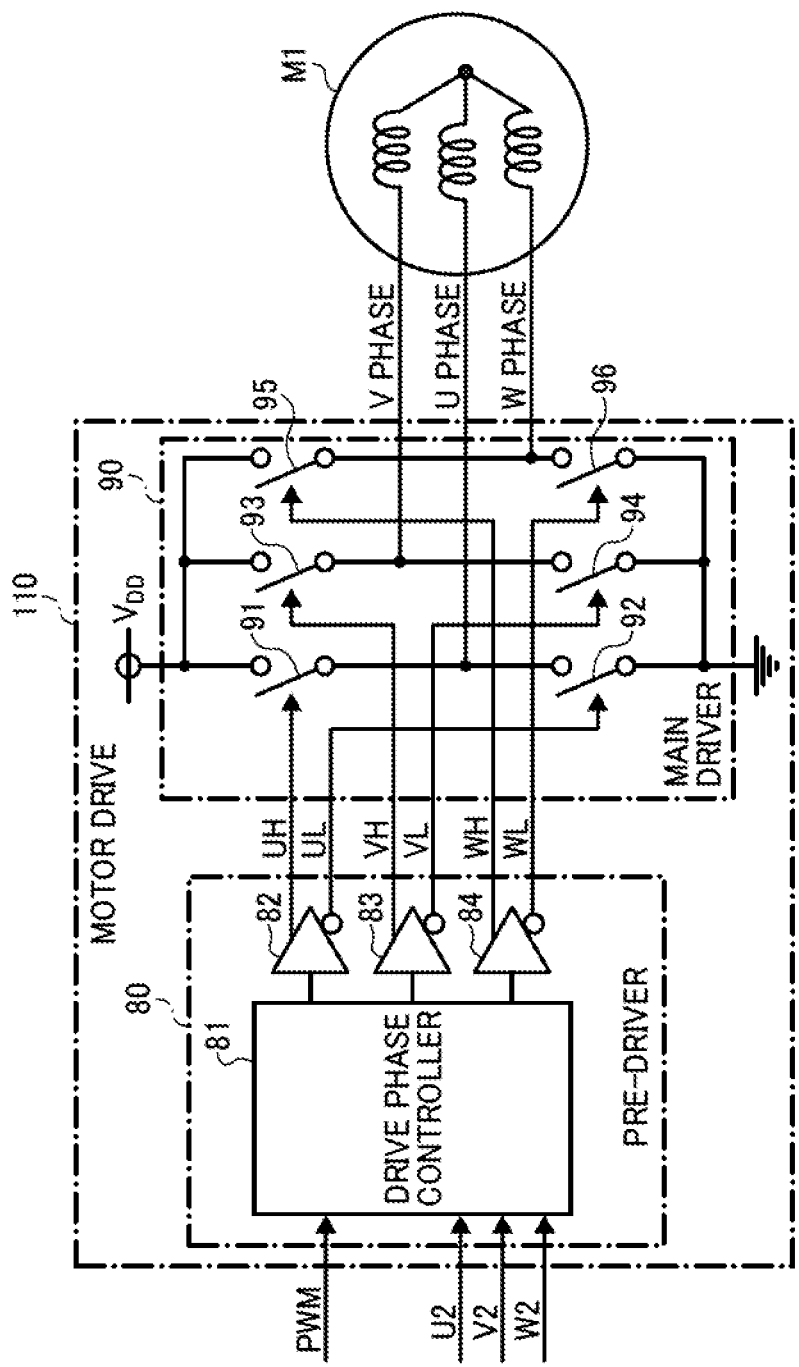
FIG. 25 is a block diagram showing the configuration of a motor driver 110 illustrated in FIG. 24.

FIG. 25 is a block diagram showing the configuration of the motor driver 110 illustrated in FIG. 24. Referring to FIG. 25, the motor driver 110 includes a pre-driver 80 and a main driver 90. Three phase coils for driving the motor M1, which may be a brushless DC motor, are identified as U phase, V phase, and W phase, and one ends of the coils are Y-connected inside the motor M1. The other ends of the coils are connected to high-side switching elements 91, 93, and 95 on a power source side and low-side switching elements 92, 94, and 96 on a ground side inside the main driver 90. Switch control signals UH, UL, VH, VL, WH, and WL for driving the respective switching elements 91 to 96 are output from the pre-driver 80.

Referring to FIG. 25, the pre-driver 80 includes a drive phase controller 81 and three drive amplifiers 82, 83, and 84. The drive phase controller 81 outputs the PWM signal from the motor controller 100 to one of the drive amplifiers 82, 83, and 84 selectively and successively based on the phase detection signals U2, V2, and W2. The drive amplifier 82 generates a pair of control signals UH and UL based on the output from the drive phase controller 81, and on-off controls the high-side switching element 91 and the low-side switching element 92 according to the control signals UH and UL, respectively. The drive amplifier 83 generates a pair of control signals VH and VL based on the output from the drive phase controller 81, and on-off controls the high-side switching element 93 and the low-side switching element 94 according to the control signals VH and VL, respectively. The drive amplifier 84 generates a pair of control signals WH and WL based on the output from the drive phase controller 81, and on-off controls the high-side switching element 95 and the low-side switching element 96 according to the control signals WH and WL, respectively.

Figure 26:
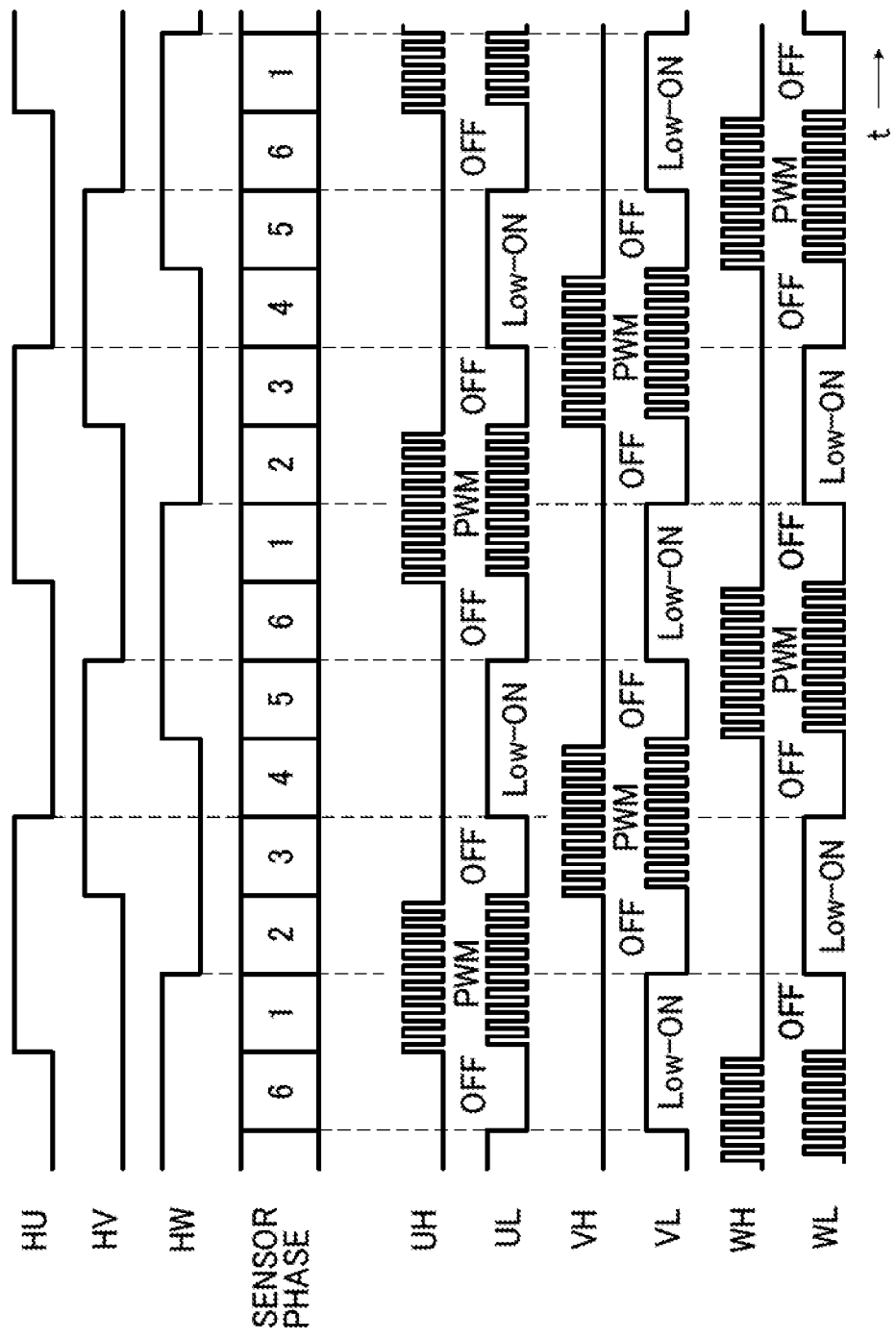
FIG. 26 is a timing diagram for various signals showing an operation by the motor driver 110 illustrated in FIG. 25.

FIG. 26 is a timing diagram for various signals showing an operation of the motor driver 110 illustrated in FIG. 25. FIG. 26 shows an example of phase switching operation based on the signal logic of the phase detection signals U2, V2, and W2, which is a typical operation for driving a brushless DC motor. The motor controller 100 illustrated in FIG. 24 controls an appropriate duty cycle of the PWM signal based on the phase information of the rotating motor M1 as accurately as possible, and outputs the PWM signal to the motor driver 110. The drive phase controller 81 illustrated in FIG. 25 generates commutation signals HU, HV, and HW that indicate whether the signal levels of the respective phase detection signals U1, V1, and W1 equals to or exceeds the zero-cross level or not based on the phase detection signals U2, V2, and W2. The drive phase controller 81 PWM-controls one of the drive amplifiers 82, 83, and 84, and brings the pair of control signals from one of the other two amplifiers to a low level based on the commutation signals HU, HV, and HW. The drive phase controller 81 brings the control signals of the high-side and low-side switching elements of the remaining one amplifier to a low level and a high level, respectively. Thus, the drive phase controller 81 divides the state into a phase in which synchronous rectification is performed according to the PWM duty cycle, a phase in which only the low-side switching element is turned on, and a phase in which both the high-side and low-side switching elements are turned off.

In the motor apparatus according to Embodiment 4, additional sensor is unnecessary since the sensors S1, S2, and S3 are commonly utilized as sensors for commutating coil currents needed for driving the motor M1 which may be composed of a brushless DC motor. Namely, since the motor drive controller 7 uses commutation signals of coil currents of a sensor typically included in a conventional motor apparatus, the phase information detector 6 can obtain phase information in large amounts.

Modifications

The voltage level detectors in accordance with Embodiments 1 and 2 are configured to output the holding level signal LV(n) as the voltage level information signal PhC, but their configurations are not limited thereto. For example, the voltage level detectors may be configured to output the comparator output signal Sco and/or the threshold level switching signal Sth as the voltage level information signal PhC. The comparator output signal or voltage level information signal according to each Embodiment is one example of the voltage level detection signal indicating that the input signal has reached the threshold level. Accordingly, the comparator output signal in each Embodiment can be used as the voltage level information signal PhC.

In the voltage level detectors in accordance with Embodiments 1 and 2, a threshold changer is composed of the threshold level switching circuit 5, 5a, or 5b, but is not limited thereto. The threshold changer may be configured so as to select a threshold level using a selector. In Embodiments 1 and 2, the threshold level switching circuits 5, 5a, and 5b are each composed of multiple latch circuits and logical gates, but their configurations are not limited thereto. The threshold level switching circuit may have a circuit configuration different from that shown in FIG. 4, 7, or 10.

The voltage level detector according to Embodiment 1 is capable of detecting the voltage level of, for example, sawtooth waves. The input signal X to the voltage level detector only has to monotonically increase or decrease within a specified period. For example, the voltage level detectors may be configured to reset the voltage level detection operation when the input signal X reaches a predetermined threshold level.

In Embodiment 3, the voltage level detector 1A is used for detecting phase of the motor. Alternatively, the voltage level detector can be used for other various purposes. For example, the voltage level detector according to each Embodiment may be used for an A/D converter or a peak-hold circuit. Not only the voltage level detector 1A but also the voltage level detector according to each Embodiment may be used for detecting phase of the motor.

The motor apparatus in accordance with Embodiment 4 includes the phase information detector 6, but the configuration thereof is not limited thereto. For example, the motor apparatus may be configured to detect zero-cross phase based on differential signals (detection signal and reverse phase signal) from the sensor circuit. Alternatively, the motor apparatus may be configured to detect rotation phase interval by detecting an intersection of a detection signal and a reverse phase signal at an interval of 30° of sine waves.

The voltage level detector 1 in accordance with Embodiment 1 detects the voltage level of the input signal X which monotonically increases or decreases, but the input signal is not limited thereto. The voltage level detector 1 is capable of detecting the voltage level of an input signal which increases (or decreases) while slightly fluctuating or another input signal which increases (or decreases) in a micro stepwise manner. The voltage level detector 1 is capable of detecting the voltage level of an input signal which increases or decreases while fluctuating within a range narrower than the interval of the threshold levels LV(n). The same applies to the voltage level detectors 1a, 1b, 1A, and 1B.

In Embodiment 1, the inversion input terminal of the comparator 3 is connected to the variable voltage source 4, but the configuration of the comparator 3 is not limited thereto. The inversion input terminal and non-inversion input terminal of the comparator 3 may be exchanged in terms of connection. In this case, the logical level (high level/low level) of each comparator output signal Sco is inverted. Similarly, the inversion input terminal and non-inversion input terminal of each of the comparators 31 to 33, 11 to 13, and 71 to 73 and the differential amplifiers 121 to 123 may be exchanged in terms of connection.

The voltage level detector 1 in accordance with Embodiment 1 includes the comparison result holding circuit 50 illustrated in FIG. 4. The configuration of the comparison result holding circuit 50 illustrated in FIG. 4 is just an example and not limited thereto. Similarly, the configurations of the comparison result holding circuits 50A, 50a, and 50b illustrated in corresponding figures are just examples and not limited thereto.

Numerous additional modifications and variations are possible in light of the above teachings. It is therefore to be understood that within the scope of the appended claims, the disclosure of the present invention may be practiced otherwise than as specifically described herein. For example, elements and/or features of different illustrative embodiments may be combined with each other and/or substituted for each other within the scope of this disclosure and appended claims.

What is claimed is:

1. A voltage level detector, comprising:
a comparator that compares a voltage level of an increasing or decreasing input signal with a threshold level, and generates and outputs a voltage level detection signal indicating that the input signal has reached the threshold level; and
a threshold level changer that changes the threshold level of the comparator based on the voltage level detection signal by increasing the threshold level when the input signal is monotonically increasing and decreasing the threshold level when the input signal is monotonically decreasing.

2. A motor drive controller, comprising:
the voltage level detector according to claim 1;
a motor controller that outputs a drive signal based on the voltage level detection signal output from the voltage level detector; and
a motor driver that drives a motor based on the drive signal.

3. A motor apparatus, comprising:
the motor drive controller according to claim 2; and
a motor driven-controlled by the motor drive controller.

4. A voltage level detector, comprising:
a plurality of comparators each having a different threshold level, each of the comparators comparing a voltage level of a fluctuating input signal with a threshold level thereof and generating and outputting a voltage level detection signal indicating that the input signal has reached the threshold level; and
a threshold level changer that changes the threshold levels of the comparators based on the voltage level detection signals by, when the input signal has increased to reach one of the threshold levels, raising the threshold levels which are smaller than the one of threshold level there above, and when the input signal has decreased to reach one of the threshold levels, lowering the threshold levels which are larger than the one of the threshold levels there below.

5. The voltage level detector according to claim 4, wherein the plurality of comparators includes:
a first comparator having a first threshold level;
a second comparator having a second threshold level larger than the first threshold level; and
a third comparator having a third threshold level larger than the second threshold level,
wherein when the input signal has increased to reach the second threshold level, the threshold level changer raises the first threshold level above the third threshold level.

6. The voltage level detector according to claim 4, wherein the plurality of comparators includes:
a first comparator having a first threshold level;
a second comparator having a second threshold level larger than the first threshold level;
a third comparator having a third threshold level larger than the second threshold level; and a fourth comparator having a fourth threshold level larger than the third threshold level, wherein when the input signal has increased to reach the third threshold level, the threshold level changer raises the first threshold level above the fourth threshold level, and when the input signal has decreased to reach the second threshold level, the threshold level changer lowers the fourth threshold level below the first threshold level.

7. The voltage level detector according to claim 4, further comprising:

a plurality of latch circuits each capturing and holding the voltage level detection signal from one of the comparators which is connected to the threshold level changer; and an encoder that converts the voltage level detection signal held by each of the latch circuits into a threshold level changing signal for changing the threshold level of each of the comparators.

8. A method of detecting voltage level, comprising:

comparing a voltage level of a fluctuating input signal with a plurality of threshold levels;

generating and outputting voltage level detection signals each indicating that the input signal has reached each of the threshold levels; and changing the threshold levels based on the voltage level detection signals, the changing including:

when the input signal has increased to reach one of the threshold levels, raising the threshold levels which are smaller than the one of the threshold levels there above, and when the input signal has decreased to reach one of the threshold levels, lowering the threshold levels which are larger than the one of the threshold levels there below.

* * * * *